United States Patent
Ji et al.

(10) Patent No.: US 11,495,521 B2
(45) Date of Patent: Nov. 8, 2022

(54) POWER MODULE AND METHOD FOR MANUFACTURING THE SAME

(71) Applicant: Delta Electronics (Shanghai) CO., LTD, Shanghai (CN)

(72) Inventors: Pengkai Ji, Shanghai (CN); Shouyu Hong, Shanghai (CN); Yiqing Ye, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 21 days.

(21) Appl. No.: 16/936,798

(22) Filed: Jul. 23, 2020

(65) Prior Publication Data
US 2021/0066170 A1  Mar. 4, 2021

(30) Foreign Application Priority Data
Aug. 30, 2019  (CN) .......................... 201910812457.5

(51) Int. Cl.
*H01L 23/49*  (2006.01)
*H01L 27/06*  (2006.01)
(Continued)

(52) U.S. Cl.
CPC .......... *H01L 23/49* (2013.01); *H01L 21/4885* (2013.01); *H01L 23/36* (2013.01);
(Continued)

(58) Field of Classification Search
CPC ....... H01L 23/13; H01L 23/145; H01L 23/15; H01L 23/28; H01L 23/31; H01L 23/3114;
(Continued)

(56) References Cited

U.S. PATENT DOCUMENTS 5,903,437 A  *  5/1999  Pierson .............. H01L 23/3675
                                                361/719
6,287,949 B1  9/2001  Mori et al.
(Continued)

FOREIGN PATENT DOCUMENTS

CN        102648667 A       8/2012
CN        104980003 A       10/2015
(Continued)

OTHER PUBLICATIONS

The 1st Office Action dated Aug. 24, 2021 for IN patent application No. 202034032108.
(Continued)

*Primary Examiner* — Eduardo A Rodela
(74) *Attorney, Agent, or Firm* — Qinghong Xu

(57) ABSTRACT

The present disclosure provides a power module and a method for manufacturing the power module. The power module includes a chip, a passive element and connection pins. The connection pins are provided on a pin-out surface of the power module, and are electrically connected to at least one of a chip terminal of the chip and the passive element; a projection of the chip on the pin-out surface of the power module does not overlap with a projection of the passive element on the pin-out surface of the power module, and an angle between the terminal-out surface of the chip and the pin-out surface of the power module is greater than 45° and less than 135°.

20 Claims, 28 Drawing Sheets

(51) Int. Cl.
*H01L 21/48* (2006.01)
*H01L 23/36* (2006.01)
*H01L 25/16* (2006.01)
*H01L 49/02* (2006.01)

(52) U.S. Cl.
CPC .......... *H01L 25/16* (2013.01); *H01L 27/0629* (2013.01); *H01L 28/10* (2013.01)

(58) Field of Classification Search
CPC ... H01L 23/3121; H01L 23/48; H01L 23/481; H01L 23/482; H01L 23/49517; H01L 23/49541; H01L 23/49548; H01L 23/49565; H01L 23/498; H01L 23/49811; H01L 23/49838; H01L 23/49861; H01L 23/49; H01L 23/49589; H01L 23/49575; H01L 23/50; H01L 23/52; H01L 23/5222; H01L 23/5227; H01L 23/5223; H01L 23/528; H01L 23/5283; H01L 23/5386; H01L 23/58; H01L 23/64; H01L 23/642; H01L 23/645; H01L 21/4885; H01L 25/16; H01L 27/0288; H01L 27/0629; H01L 27/101; H01L 28/10; H01L 28/40
See application file for complete search history.

(56) References Cited

U.S. PATENT DOCUMENTS

| | | | |
|---|---|---|---|
| 6,378,514 B1* | 4/2002 | Kaminaga | H01F 38/12 123/634 |
| 6,984,885 B1* | 1/2006 | Harada | H01L 24/10 257/678 |
| 7,341,052 B2* | 3/2008 | Kawakita | H01L 24/49 123/647 |
| 7,489,226 B1 | 2/2009 | Chignola et al. | |
| 8,610,528 B1 | 12/2013 | Luzanov | |
| 9,136,251 B2* | 9/2015 | Cheah | H01L 24/06 |
| 9,490,195 B1* | 11/2016 | Prabhu | H01L 23/49541 |
| 10,354,978 B1* | 7/2019 | Chen | H01L 21/78 |
| 2005/0285262 A1* | 12/2005 | Knapp | H01L 24/85 257/723 |
| 2006/0038549 A1 | 2/2006 | Mehrotra et al. | |
| 2009/0278246 A1 | 11/2009 | Hoshino et al. | |
| 2009/0296360 A1 | 12/2009 | Doblar et al. | |
| 2009/0322291 A1* | 12/2009 | Ngo | H02M 3/1584 323/272 |
| 2010/0085111 A1* | 4/2010 | Ootani | H02M 3/073 327/536 |
| 2010/0289135 A1 | 11/2010 | Otremba et al. | |
| 2011/0284989 A1* | 11/2011 | Umeno | H01L 23/49822 257/531 |
| 2012/0014059 A1 | 1/2012 | Zeng et al. | |
| 2012/0241933 A1* | 9/2012 | Doi | H01L 23/49575 257/676 |
| 2012/0273932 A1 | 11/2012 | Mao et al. | |
| 2013/0075915 A1* | 3/2013 | Kim | H01L 24/73 257/773 |
| 2014/0070381 A1* | 3/2014 | Doi | H01L 24/80 438/123 |
| 2014/0126258 A1* | 5/2014 | Neyman | H02M 7/2176 363/84 |
| 2015/0287670 A1* | 10/2015 | Fukase | H01L 23/562 361/813 |
| 2016/0293528 A1 | 10/2016 | Otremba et al. | |
| 2016/0300659 A1 | 10/2016 | Zhang et al. | |
| 2016/0358886 A1* | 12/2016 | Meyer-Berg | H01L 24/92 |
| 2016/0379967 A1* | 12/2016 | Gamini | H01L 21/4857 257/659 |
| 2017/0012442 A1 | 1/2017 | Zeng et al. | |
| 2018/0145060 A1* | 5/2018 | Appelt | H01L 25/0652 |
| 2018/0277470 A1 | 9/2018 | Ye et al. | |
| 2020/0126895 A1* | 4/2020 | Saklang | H01L 23/49582 |
| 2020/0214174 A1* | 7/2020 | Zhong | H01L 23/3675 |
| 2021/0036059 A1* | 2/2021 | Leng | H01L 23/13 |
| 2021/0271275 A1* | 9/2021 | Kim | H01L 23/645 |
| 2021/0313283 A1* | 10/2021 | Wilson | H01L 24/08 |

FOREIGN PATENT DOCUMENTS

| | | |
|---|---|---|
| CN | 102648667 B | 9/2016 |
| CN | 106961793 A | 7/2017 |
| CN | 108711570 A | 10/2018 |
| WO | 2016150391 A1 | 9/2016 |

OTHER PUBLICATIONS

The 1st Office Action dated Aug. 24, 2021 for CN patent application No. 201910812457.5.

* cited by examiner

POWER MODULE AND METHOD FOR MANUFACTURING THE SAME

CROSS REFERENCE

This application is based upon and claims priority to Chinese Patent Application No. 201910812457.5, filed on Aug. 30, 2019, the entire contents of which are incorporated herein by reference.

TECHNICAL FIELD

The present disclosure relates to the technical field of power electronic device, and in particular to a power module and a method for manufacturing the power module.

BACKGROUND

As the demand for power and current increases, various intelligent integrated circuit chips have increasingly more functions, more power consumption, and more devices on the motherboard. It is required that power modules have higher power density or a single module has higher capability for outputting current. In order to improve efficiency, dynamic performance and integration, the intelligent integrated circuit chips for clouds or terminals have increasingly higher requirements on the power modules, and it is desired that the module have good performance in bidirectional heat dissipation. In addition, the space constraint in data centers and intelligent terminals such as mobile phones also requires the power module to have a smaller height.

FIG. 1 shows a cross-sectional view of one unit in the data center, in which a heat dissipator 72, a load chip 73, a data center motherboard 74, and a module case 75 are shown. It is illustrated that when a power module 100 is placed over the data center motherboard 74, considering that the heat dissipator 72 is shared with the intelligent integrated circuit chip, especially the load chip 73 such as a Graphics Processing Unit (GPU), a display processing unit, etc., the power module is often required to have a small height h1, for example less than 4 mm. When the power module 100 is attached to a lower surface of the data center motherboard 74, the height h2 is required to be less than 2.5 mm so as to adapt to most application scenarios. FIG. 2 is a schematic diagram of an internal space arrangement of a smart terminal such as a mobile phone, in which a mobile phone case 78, a power module 100, a display screen 76, a battery 77 and a mobile phone motherboard 79 are shown. Compared with the data center, the space requirements in the smart terminal such as the mobile phone are more stringent. For example, FIG. 2 shows a schematic cross-section view of a mobile phone in which a height h3 above the upper surface of the mobile phone motherboard 79 or a height h4 below the lower surface of the mobile phone motherboard 79 is often only 1.2 mm.

FIGS. 3 and 4 show two structures of stacked-type power module in the prior art, that is, a chip 1 and a passive element 2 are stacked one on top of the other to form a power module. Here, the passive element 2 refers to a passive device such as an inductor, a capacitor, a transformer, or the like. The chip 1 and the passive element 2 are stacked to form the power module. Although this structure is advantageous in reducing a footprint, it is difficult to reduce the height because the height of two devices stacked together will always be greater than that of a single device. In addition, it is difficult to realize a symmetry of heat dissipation performance on the upper and lower surfaces of a single device. As shown in FIG. 3, downward thermal resistance of the chip 1 is easy to be small, but upward thermal resistance of the chip 1 is larger due to blocking of the passive element 2, and thus the heat dissipation performance of the chip 1 downwards is better than that upwards. As such, the heat dissipation performance on one side is worse than that on the other side, and in the actual application, it is required to be matched with the heat dissipation path of the application environment, otherwise, the actual power and current outputting capability will be affected due to the limitation of the heat dissipation path in the application environment. For example, when the chip faces the system board, and the passive element is stacked on the chip, if the thermal resistance of the heat dissipation path of the system board is relatively large, even if the thermal resistance of the heat dissipation of the power module towards the system board is very small, the heat of the power module cannot be effectively dissipated due to the excessive thermal resistance of the heat dissipation of the system board, thereby affecting the power output capability of the power module.

To provide the power supply for the intelligent integrated circuit chip, in addition to the stacked-type power module, traditional discrete devices can also be used to assemble the power module on the motherboard. For example, the discrete devices such as power devices, inductors and the like are tiled on the motherboard (i.e., projections of the power devices and inductors on the motherboard do not overlap), and are electrically connected to each other through traces on the motherboard, so as to provide power to the loads such as the intelligent integrated circuit chip and the like. In such approach, a terminal side of the chip often faces the system motherboard and the chip is surface mounted and welded to the system motherboard, and a terminal-out side of the chip is usually a side of a larger surface area. Although this can achieve a lower height, since the chip is generally thin, and the height of the passive element is generally higher than that of the chip, the space above the chip is wasted, and the footprint of the chip is relatively large, resulting in a large overall footprint of the power module. In addition, since the terminals of the chip face the circuit board (the system board) instead of the passive element, a current transmission distance from the chip to the passive element will also be long. Therefore, in the approach of assembling the power module with discrete devices, problems of yield, constraints on the footprint, and increasing demand for development resources with increasing power demand should be considered in view of a large number of devices on the motherboard.

SUMMARY

The purpose of the present disclosure is to provide a power module and a method for manufacturing the power module.

Other features and advantages of the present disclosure will become apparent from the following detailed description, or partly learned through the practice of the present disclosure.

According to a first aspect of the present disclosure, a power module is provided, including:

a chip with a chip terminal provided on a terminal-out surface of the chip;

a passive element electrically connected to the chip terminal of the chip; and connection pins provided on a pin-out surface of the power module and electrically connected to at least one of the chip terminal of the chip and the passive element, wherein a projection of the chip on the pin-out surface of the power module does not overlap with a projection of the passive element on the pin-out surface of the power module, and an angle between the terminal-out surface of the chip and the pin-out surface of the power module is greater than 45° and less than 135°.

According to a second aspect of the present disclosure, there is also provided a method for manufacturing a power module, including the following steps:

stacking and packaging a passive element and a chip in a first packaging material, so that an angle between a terminal-out surface of the chip and a stacking direction of the first packaging material is greater than 45° and less than 135°, and the passive element is electrically connected to a chip terminal of the chip, to form a power module panel;

cutting the power module panel along a first cutting plane to form a plurality of power modules, forming connection pins by conductive portions exposed after the cutting, and forming a first connection layer between a pin-out surface of the power module and the chip of the power module, the first connection layer being configured to electrically connect the connection pins to at least one of a chip terminal of the chip and the passive element of the power module;

in each of the power modules, a projection of the chip on the pin-out surface of the power module does not overlap with a projection of the passive element on the pin-out surface of the power module, and an angle between the terminal-out surface of the chip and the pin-out surface of the power module is greater than 45° and less than 135°

In order to further understand the features and technical content of the present disclosure, please refer to the following detailed description and drawings of the present disclosure. The detailed description and drawings herein are only intended to illustrate the present disclosure, but not to limit the scope of the claims of the present disclosure in any sense.

BRIEF DESCRIPTION OF THE DRAWINGS

The above and other features and advantages of the present disclosure will become more apparent from the detailed description of exemplary embodiments thereof with reference to the accompanying drawings.

REFERENCE NUMBERS

Figure 1:
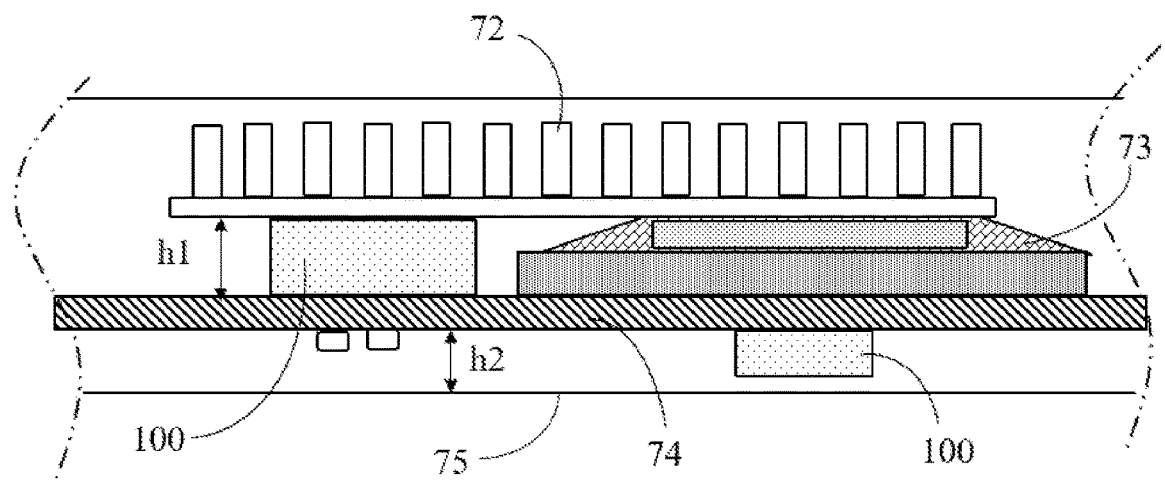
FIG. 1 is a schematic diagram of internal space of a data center in the prior art.
Figure 2:
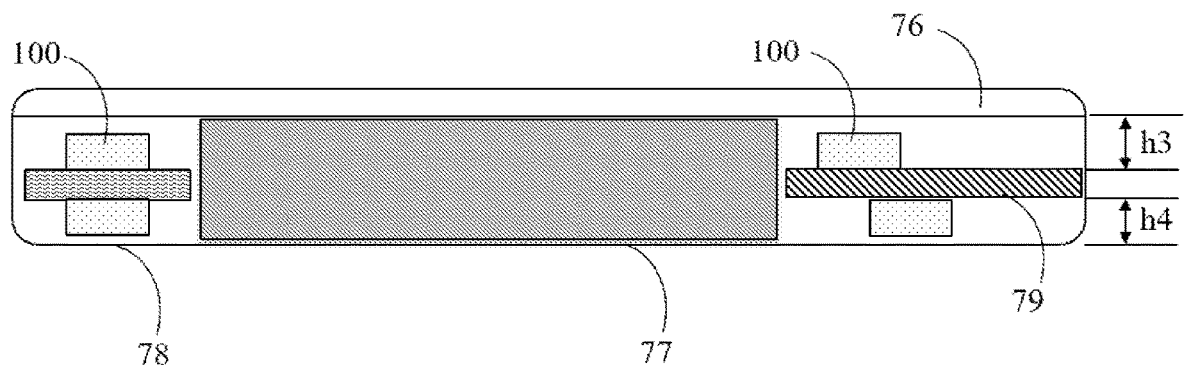
FIG. 2 is a schematic diagram of internal space of a mobile phone in the prior art.
Figure 3:
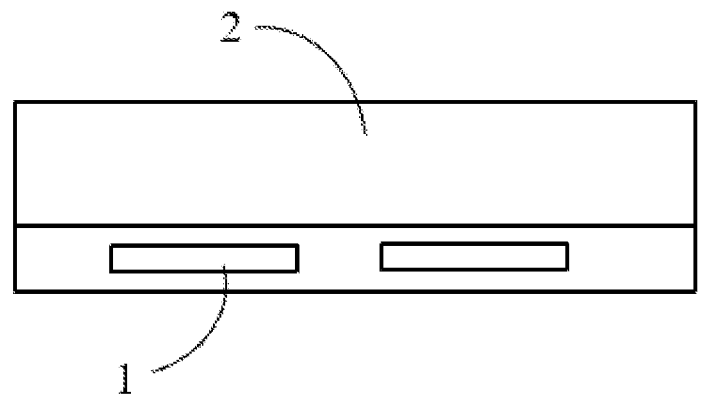
FIGS. 3 and 4 are schematic structural views of two stacked power modules in the prior art.
Figure 4:
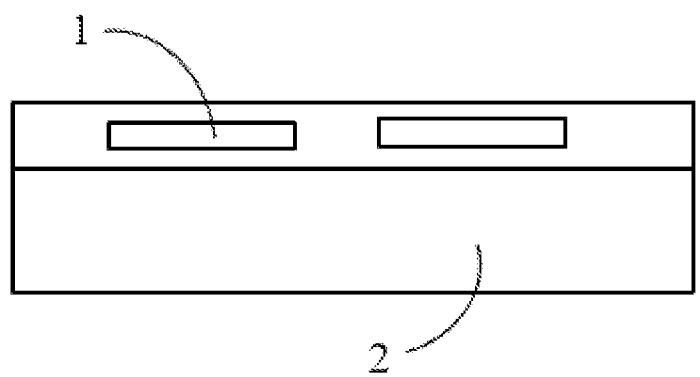

| 1 | chip | 5 | line layer |
|---|---|---|---|
| 11 | chip terminal | 52 | conductive via |
| 1a | first chip | 53 | conductive line |
| 1b | second chip | 54 | copper pillar |
| 1c | third chip | 6 | connection pin |
| 1d | fourth chip | 61 | first connection pin |
| 2 | passive element | 62 | second connection pin |
| 21 | capacitor | 71 | thermal conductive plate |
| 211 | first capacitor | 72 | heat dissipator |
| 212 | second capacitor | 73 | load chip |
| 22 | inductor | 74 | data center motherboard |
| 22a | first winding | 75 | module case |
| 22b | second winding | 76 | display screen |
| 221 | upper side pillar | 77 | battery |
| 222 | lower side pillar | 78 | mobile phone case |
| 223 | middle pillar | 79 | mobile phone motherboard |
| 23 | transformer | 8 | circuit board |
| 231 | first cover plate | 91 | first redistribution layer |
| 232 | second cover plate | 92 | cutting plane |
| 233 | magnetic pillar | 93 | second redistribution layer |
| 234 | mounting slot | 100 | power module |
| 24 | peripheral device | | |
| 3 | connection layer | | |
| 35 | welding spot | | |

4 insulating packaging material
41 first packaging material
42 second packaging material

DETAILED DESCRIPTION

Hereinafter, embodiments of the present disclosure will be described in detail, examples of which are shown in the drawings. Throughout the drawings, the same or similar reference numerals indicate the same or similar elements or elements having the same or similar functions. The embodiments described below with reference to the drawings are exemplary, and are intended to explain the present disclosure, and should not be construed as limiting the present disclosure.

In the description of the present disclosure, it should be understood that orientation or positional relationships indicated by the terms of "upper", "lower", "front", "rear", "left" "right", "vertical", "horizontal", "top", "bottom", "inner", "outer" etc., are based on the orientation or positional relationships shown in the drawings, which is only for the convenience of describing the present disclosure and simplifying the description, rather than indicating or implying the device or element must have a specific orientation or be constructed and operated in a specific orientation, and therefore cannot be construed as limiting the present disclosure.

In addition, the terms of "first" "second" and so on are used only for the purpose of description, but should not be understand as indicating or implying relative importance or implicitly indicating the number of indicated technical features. Thus, features defined with "first" and "second" may include one or more of features either explicitly or implicitly. In description of the present disclosure, the meaning of "a plurality" is at least two, such as two, three, etc., unless specifically defined otherwise.

In the present disclosure, unless otherwise clearly specified and limited, the terms such as "mounted", "connected", "coupled", and "fixed" should be understood in a broad sense. For example, it can be fixedly connected, detachably connected, or integrated; it can be directly connected or indirectly connected through an intermediate medium; it can be a connection inside two elements or an interaction between two elements, unless otherwise clearly defined. Those of ordinary skill in the art can understand the specific meanings of the above terms in the present disclosure depending on specific situations.

In the description of this specification, the description referring to the terms of "one embodiment", "some embodiments" "an example", "an specific example", or "some examples" intends that specific features, structures, materials, or characteristics described in connection with the embodiment or example are included in at least one of embodiments or examples of the present disclosure. In this specification, the schematic representations of the above terms do not necessarily refer to the same embodiment or example. Moreover, the specific features, structures, materials, or characteristics described can be combined in any one or more embodiments or examples in any suitable manner. In addition, without contradicting each other, different embodiments or examples or features of the different embodiments or examples described in this specification can be incorporated or combined by those skilled in the art.

In order to solve the technical problems in the prior art, the present disclosure provides a power module including a chip, a passive element, and a connection pin provided on a pin-out surface of the power module. A chip terminal is provided on a terminal-out surface of the chip, and the passive element is electrically connected to the chip terminal of the chip. The connection pin is electrically connected to at least one of the chip terminal of the chip and the passive element. The passive element may include at least one of an inductor, a capacitor, and other passive devices, and the number of passive elements may be one or more. A projection of the chip on the pin-out surface of the power module does not overlap with a projection of the passive element on the pin-out surface of the power module, that is, an overlap area of the projections of the chip and the passive element on the pin-out surface of the power module is 0, thereby forming a power module structure in which the chip and the passive element are tiled, which is easier to realize the power module of a small height compared with the stacked structure. Also, in this embodiment, an angle between the terminal-out surface of the chip and the pin-out surface of the power module is greater than 45° and less than 135°, that is, the chip is placed substantially vertically in the power module, so that the connection between the chip and the passive element is more direct, which can reduce current impedance and loss or parasitic inductance, and since the chip is substantially vertically arranged, it is advantageous in reducing the footprint of the power module, making the structure more compact and the power density higher.

Several implementations of the power module of the present disclosure will be described in detail below in conjunction with several specific embodiments shown in FIGS. 5 to 35.

Figure 5:
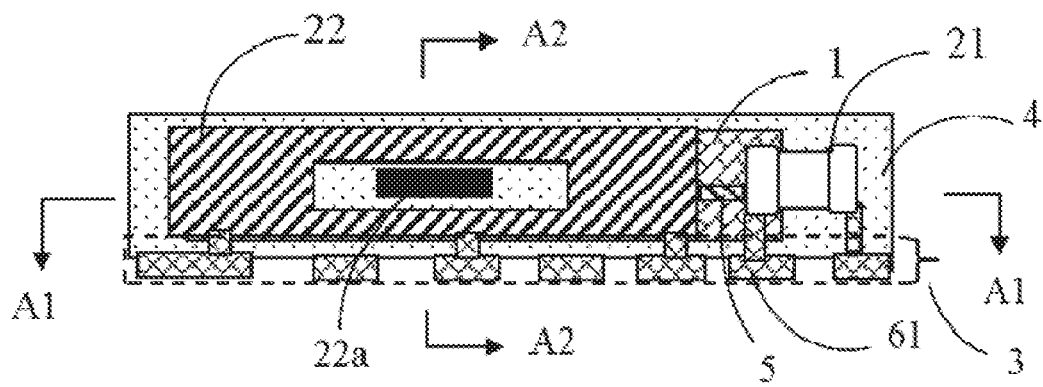
FIG. 5 is a side view of a power module according to a first embodiment of the present disclosure.
Figure 6:
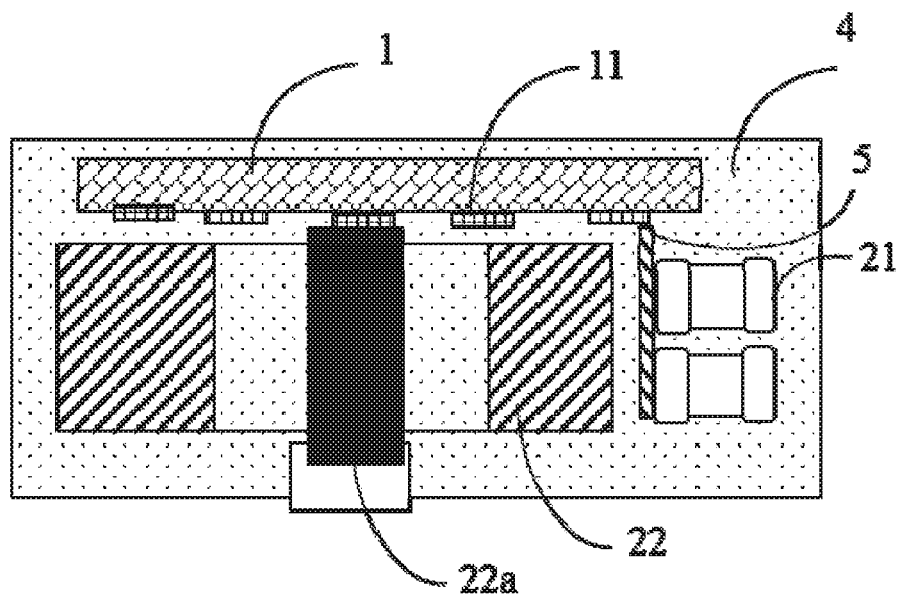
FIG. 6 is a cross-sectional view in a direction of A1-A1 in FIG. 5.
Figure 7:
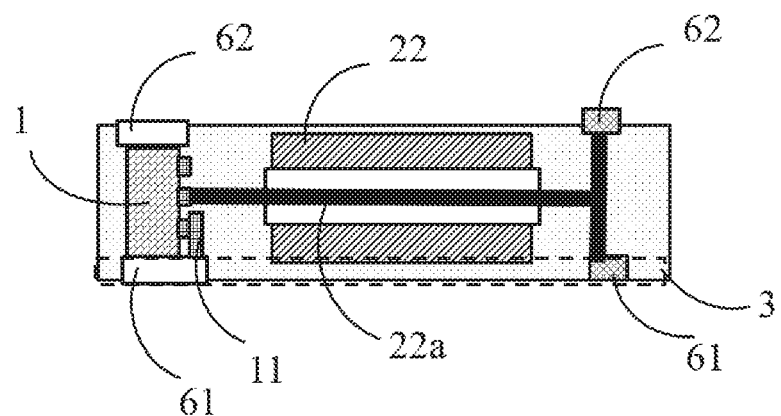
FIG. 7 is a cross-sectional view in a direction of A2-A2 of FIG. 5.

As shown in FIGS. 5-7, which are schematic structural diagrams of a power module according to a first embodiment of the present disclosure, the power module includes a chip 1 and a passive element 2 (not shown). The passive element 2 includes an inductor 22 and a capacitor 21. The chip 1 and the passive element are packaged by a packaging material 4 to form a power module. At least one side of the power module forms a pin-out surface, and connection pins 6 (not shown) are provided on the pin-out surface. The chip 1 and the passive element are electrically connected through a line layer 5, and a chip terminal 11 of the chip 1 is electrically connected to a winding 22a of the inductor 22 and to the capacitor 21 through the line layer 5. A connection layer 3 is provided between the chip 1 and the pin-out surface of the power module. The connection layer 3 electrically connects at least one of the chip 1, the inductor 22 and the capacitor 21 to the connection pins 6. The chip 1 is placed substantially vertically with respect to a lower surface of the power module, that is, the angle between the terminal-out surface of the chip 1 and the pin-out surface of the power module is greater than 45° and less than 135°. For example, the angle between the terminal-out surface of the chip 1 and the pin-out surface of the power module is 90°, that is, the terminal-out surface of the chip 1 is perpendicular to the pin-out surface of the power module. In addition, the chip 1, the inductor 22 and the capacitor 21 are tiled, and the projection of the chip 1 on the pin-out surface of the power module does not overlap with the projections of the inductor 22 and the capacitor 21 on the pin-out surface of the power module, that is, with respect to the pin-out surface of the power module, the chip 1, the inductor 22 and the capacitor 21 are located on different vertical planes. The insulating packaging material 4 is used to support and protect the chip 1 and the passive element such as the inductor 22 and the capacitor 21, etc., and can implement a three-dimensional structure of the line layer 5 and the connection layer 3.

With the structure shown in FIGS. 5-7, a height of the entire power module package is substantially determined by a length or width of the terminal-out surface of the chip 1. In an alternative embodiment, the connection pins 6 may be provided on both sides of the power module. For example, as shown in FIG. 7, which is a schematic cross-sectional view of A2-A2 in FIG. 5, change is made on the basis of FIG. 5. The change lies in that a second connection pin 62 and a first connection pin 61 are provided on the upper surface and the lower surface of the power module, respectively, thereby forming a power module structure with double pin-out surfaces. The connection layers 3 for connecting the connection pins 6 and the chip 1 can be respectively provided between the first connection pin 61 and the chip 1 or between the second connection pin 62 and the chip 1. In this way, the power module can be provided with connection pins 6 on the surfaces of both sides, and in some implementations, a structure in which the connection pins on the surfaces of both sides are symmetrically arranged can be realized. In an alternative implementation, the connection layer 3 in FIG. 5 can include a conductive via, a Re-Distribution Layer (RDL), or conductive lines in the same layer as the connection pins 6.

It is to be noted that the chip of the present disclosure includes various packaging forms of switching devices, and can also be a die.

Figure 8:
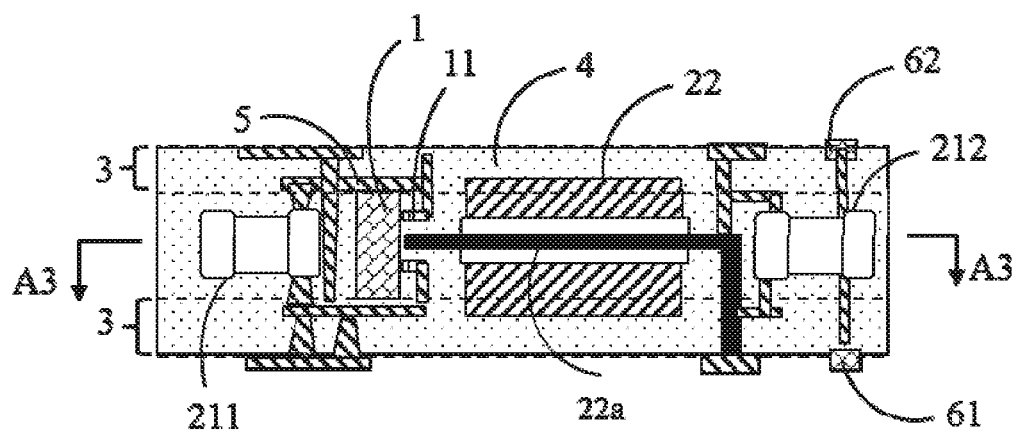
FIG. 8 is a side view of a power module according to a second embodiment of the present disclosure.
Figure 9:
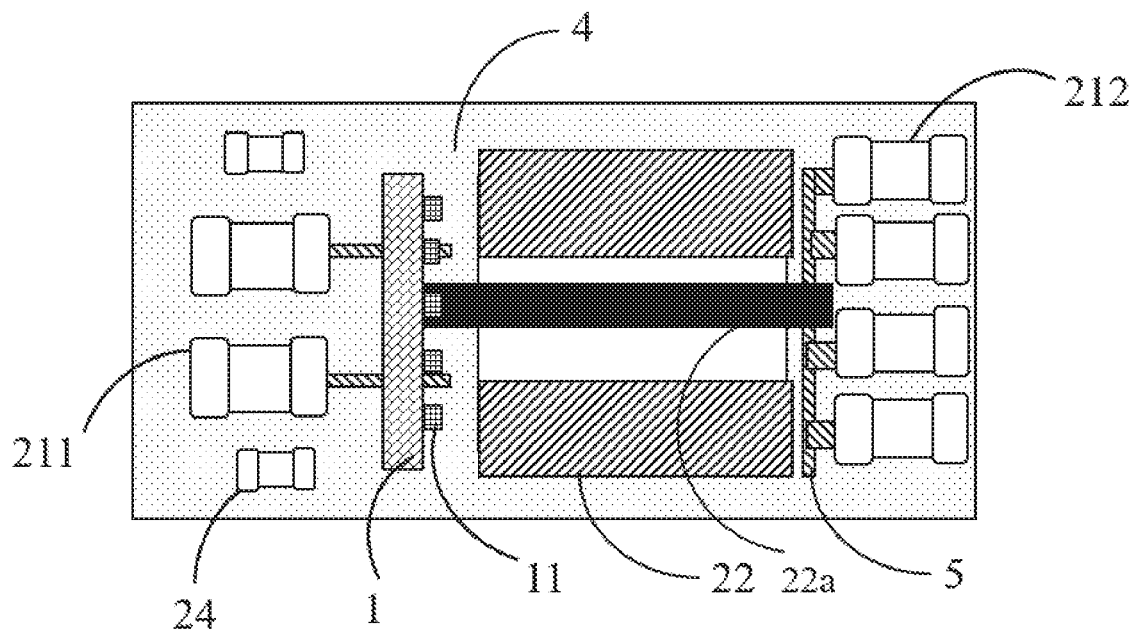
FIG. 9 is a cross-sectional view in a direction of A3-A3 in FIG. 8.

FIG. 8 and FIG. 9 show schematic structural diagrams of a power module according to a second embodiment of the present disclosure. In this embodiment, the passive element includes an inductor 22 and two sets of capacitors, that is, a first capacitor 211 and a second capacitor 212. The chip 1, the inductor 22, the first capacitor 211, and the second capacitor 212 are all tiled, that is, the projection of the chip 1 on the pin-out surface of the power module does not overlap with the projections of the inductor 22, the first capacitor 211, and the second capacitor 212 on the pin-out surface of the power module.

As shown in FIG. 8, on the basis of the first embodiment, a first capacitor 211 can be further provided on the left side of the chip 1. Thus, the power module of this second embodiment can be used to implement various circuits, such as the Buck circuit shown in FIG. 49. The first capacitor 211 provided on the left side of the chip 1 in FIG. 8 can be the input capacitor Cin of the Buck circuit shown in FIG. 49. The chip 1 includes a half-bridge circuit, that is, chip 1 includes two switches connected in series. The connection point (for example, SW1 or SW2 in FIG. 49) between the switches in series is electrically connected to the winding 22a of the inductor 22. The inductor 22 can be provided on the right side of the chip 1.

In FIG. 9, the terminal-out surface of the chip 1 where the chip terminal 11 is located faces the inductor 22. In other alternative implementations, the terminal-out surface of the chip 1 where the chip terminal 11 is located may be disposed with back towards the inductor 22. A second capacitor 212 is provided on the right side of the inductor 22 or on an output terminal of the inductor 22, and the second capacitor 212 may be the output capacitor Co of the Buck circuit shown in FIG. 49. In addition, other peripheral devices 24 may also be tiled. In the view of FIG. 8, the connection pins such as the first connection pin 61 and the second connection pin 62 are provided on the upper and lower surfaces of the power module. In addition, the line layer 5 can be disposed on the upper and lower sides or the periphery of the chip 1 to realize the electrical connection between the chip terminal 11 of the chip and the first capacitor 211 by bypassing the chip 1. In this embodiment, interconnections between the chip 1, the passive element 2 and the connection pins are realized by the line layer 5 in cooperation with the connection layer 3. The multiple electrical connections employed in this embodiment can reduce resistance and parasitic inductance, which is advantageous in improving efficiency and dynamic performance. Moreover, the connection pins such as pads can be symmetrically arranged on the upper and lower surfaces, which is convenient for application.

Figure 10:
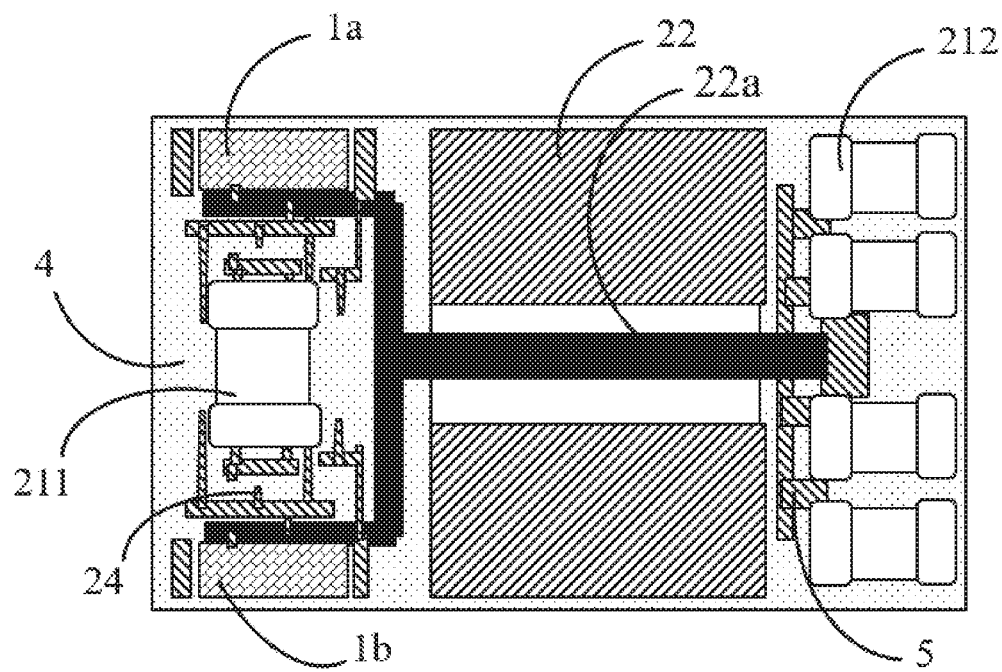
FIG. 10 is a top view of a power module including an inductor according to a third embodiment of the present disclosure.
Figure 11:
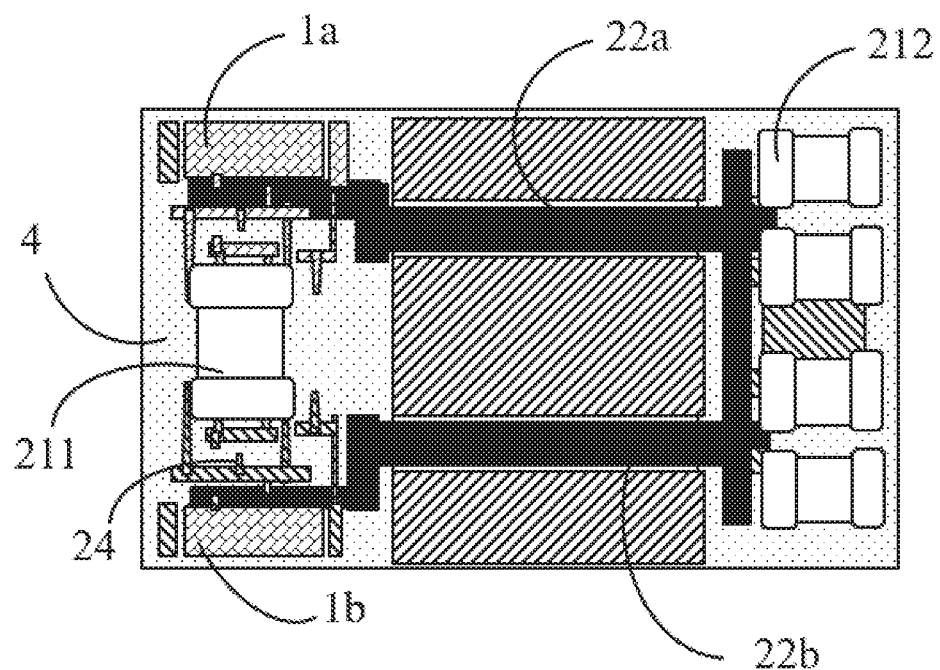
FIG. 11 is a top view of a power module including two inductors according to the third embodiment of the present disclosure.
Figure 12:
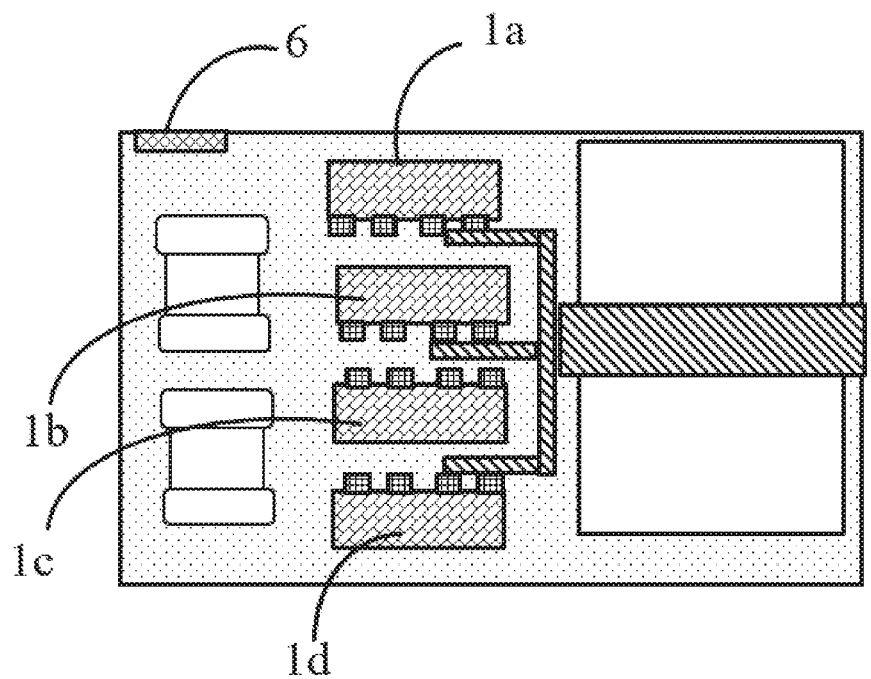
FIG. 12 is a top view of a power module packaged with four chips according to the third embodiment of the present disclosure.

FIGS. 10-12 are schematic structural diagrams of a power module according to a third embodiment of the present disclosure. This embodiment differs from the second embodiment in that a plurality of chips can be packaged in one power module. In some applications, the plurality of chips can operate in parallel to enable greater current or power of the power module. FIGS. 10, 11 and 12 are all top views, and respectively show three optional power module structures with the plurality of chips. It should be understood that projections of the plurality of chips on the pin-out surface of the power module do not overlap with each other.

In FIG. 10, the power module includes two chips: a first chip 1a and a second chip 1b. The first chip 1a and the second chip 1b can each have a switching element, and a connection point of the first chip 1a and the second chip 1b are electrically connected to the first winding 22a of the inductor 22. In an alternative implementation, both the first chip 1a and the second chip 1b in FIG. 10 can include a half-bridge circuit, and SW terminals of the two half-bridge circuits (that is, the connection points of the upper bridge arm switching transistors and the lower bridge arm switching transistors in the half-bridge circuits) are short-circuited with each other and then electrically connected to the first winding 22a of the inductor 22 to achieve a larger output current. In this embodiment, the first chip 1a and the second chip 1b can be arranged "face-to-face", that is, the terminal-out surface of the first chip 1a and the terminal-out surface of the second chip 1b are arranged facing each other A first capacitor 211 can be provided between the two chips as an input capacitor, and the electrical connection lines between the first capacitor 211 and the first chip 1a and between the first capacitor 211 and the second chip 1b can be disposed shorter, which can reduce the resistance and parasitic inductance between the first capacitor 211 and the first chip 1a and between the first capacitor 211 and the second chip 1b, improve efficiency and dynamic performance, and make the structure compact and the power density high. It should be understood that the terminal-out surface of the chip described in the present disclosure refers to a surface where a power terminal of the chip is led out. In the chip where a planar-type device is included, the terminal-out surface refers to a surface where the chip terminal 11 is provided. In the chip where a vertical-type device is included, the terminal-out surface refers to a surface where a gate or an electrode for controlling the switching operation is provided.

In FIG. 11, the power module includes two chips: the first chip 1a and the second chip 1b. In this embodiment, both the first chip 1a and the second chip 1b include a half-bridge circuit. The power module includes two inductive windings: a first winding 22a and a second winding 22b. The connection points (that is, the SW terminals) of the upper and lower switching transistors of the two half-bridge circuits are electrically connected to the two inductive windings, for example, the SW terminal of the first chip 1a is electrically connected to the first winding 22a, and the SW terminal of the second chip 1b is electrically connected to the second winding 22b. The two inductors may be two independent inductors, or may be a magnetic integrated structure as shown in FIG. 11. With this structure, multiple Buck circuits can be packaged in one power module, and a simple parallel or interleaved parallel connection of the multiple Buck circuits can be implemented, which is advantageous in increasing the power while reducing output ripples and increasing the power density.

In FIG. 12, the power module includes four chips: a first chip 1a, a second chip 1b, a third chip 1c, and a fourth chip 1d. There may be no other devices provided between the four chips to make the structure of the power module more compact. In this embodiment, the first chip 1a, the second chip 1b, the third chip 1c, and the fourth chip 1d are sequentially arranged in a column. Specifically, the terminal-out surface of the second chip 1b and the terminal-out surface of the third chip 1c are disposed face to face, and the terminal-out surface of the first chip 1a and the terminal-out surface of the fourth chip 1d are disposed face to face. As such, the capability of a larger power current output can be realized in a compact and small volume. In other possible implementations, the arrangements of the four chips and the orientation relationships of the terminal-out surfaces may be different.

Figure 13:
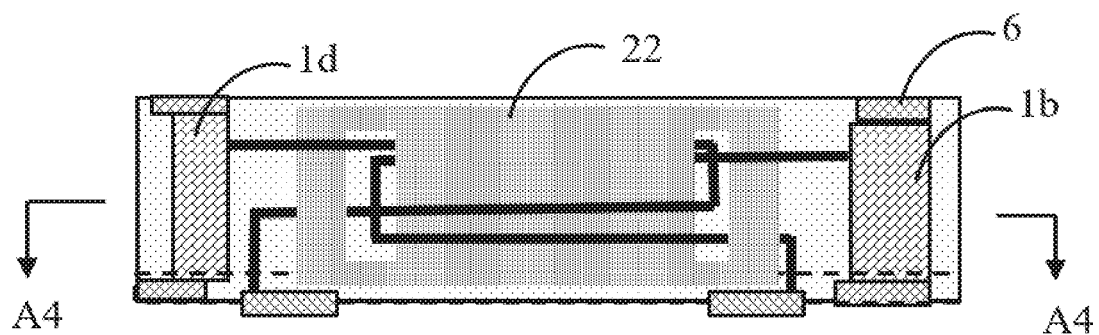
FIG. 13 is a side view of a power module according to a fourth embodiment of the present disclosure.
Figure 14:
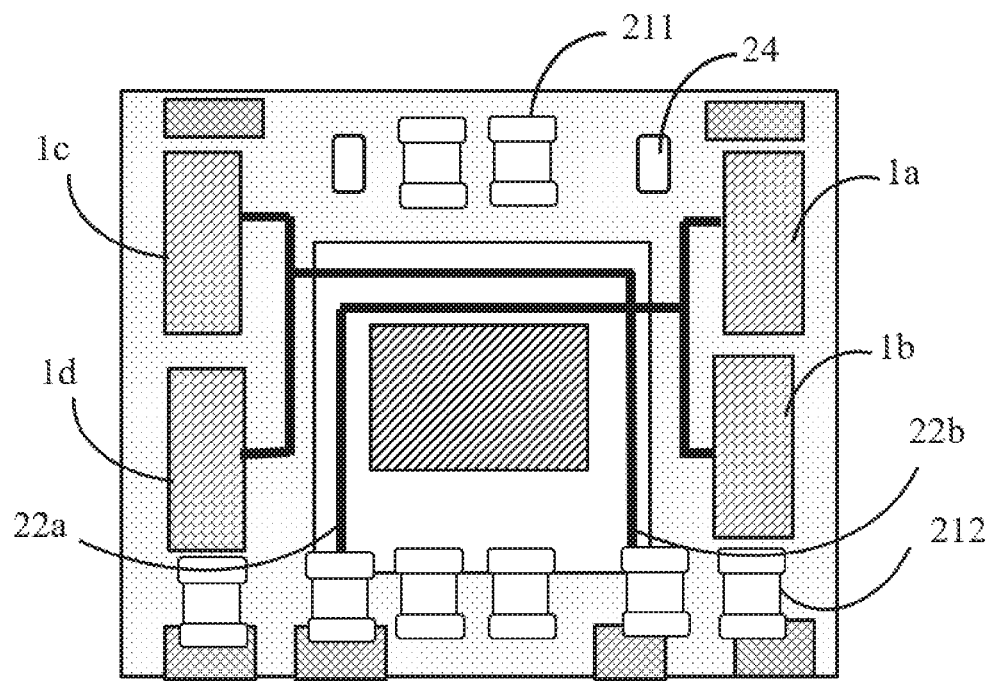
FIG. 14 is a cross-sectional view in a direction of A4-A4 in FIG. 13.

FIGS. 13 and 14 are schematic structural diagrams of a power module according to a fourth embodiment of the present disclosure. In this embodiment, the power module includes two chipsets, each of the chipsets includes at least one chip, and the terminal-out surfaces of the two chipsets are provided "face to face", and at least one passive element is provided between the terminal-out surfaces of the two chipsets. Specifically, each chipset may include two chips, for example, the first chip 1a and the second chip 1b constitute one chipset, and the third chip 1c and the fourth chip 1d constitute another chipset. From the view of FIG. 14, the terminal-out surface of the first chip 1a and the second chip 1b are both orientated towards left, the terminal-out surfaces of the third chip 1c and the fourth chip 1d are both orientated towards right. The power module also includes a reversely-coupled inductor 22 and a plurality of capacitors 211, 212. The inductor 22 is located between the terminal-out surfaces of the two chipsets. The second chip 1b is electrically connected to the first winding 22a, the fourth chip 1d is electrically connected to the second winding 22b, and the second chip 1b and the fourth chip 1d may each have the half-bridge circuit. The first chip 1a and the third chip 11 may each have the half-bridge circuit, the SW terminal of the chip 1a is also electrically connected to the first winding 22a, and the SW terminal of the chip 1c is also electrically connected to the second winding 22b. Compared with the structure in which only the second chip 1b and the fourth chip 1d are connected to the windings, the structure of the power module with four chips shown in FIGS. 13 and 14 can further increase the current output capability. Further, in this embodiment, in the case where each of the four chips 1a, 1b, 1c, 1d is a single switch, or includes multiple switches connected in parallel, the first chip 1a and the second chip 1b can be connected in series and then the SW terminal can be electrically connected to the first winding 22a, and the third chip 1c and the fourth chip 1d can be connected in series and then the SW terminal can be electrically connected to the second winding 22b. The specific connection manners can be flexibly applied as needed. In addition, with the structure of the power module of this embodiment, the current transmission distance can be shortened, the transmission efficiency can be improved, the reversely-coupled power module can be flexibly formed, and the power density can be high.

Figure 15:
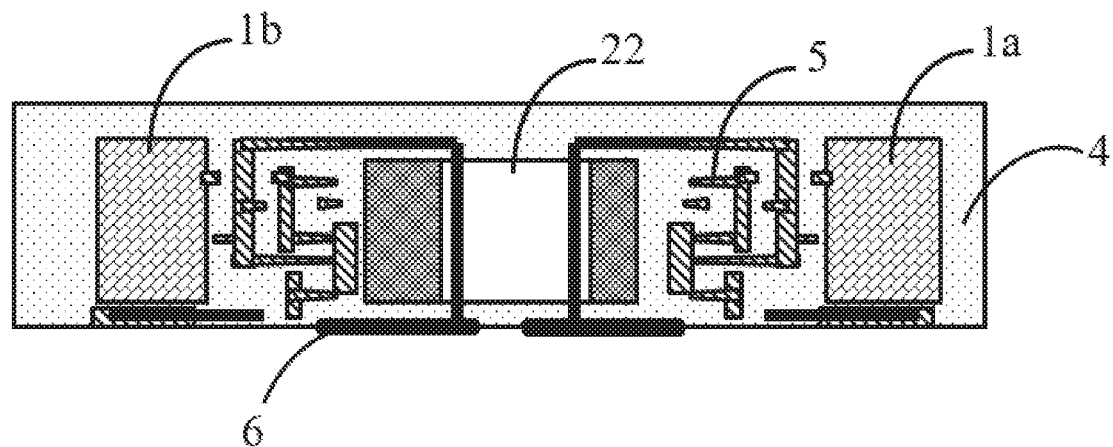
FIG. 15 is a side view of a power module according to a fifth embodiment of the present disclosure.
Figure 16:
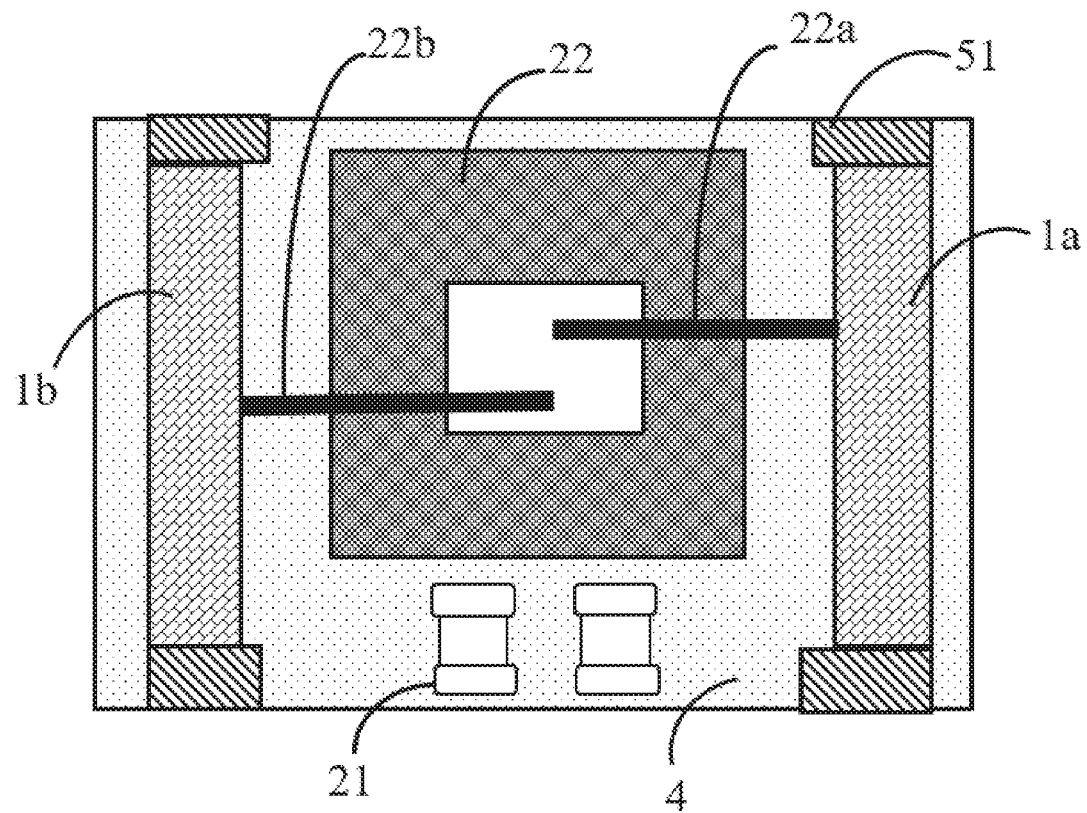
FIG. 16 is a top view of the power module according to the fifth embodiment of the present disclosure.

FIGS. 15 and 16 are schematic structural diagrams of a power module according to a fifth embodiment of the present disclosure. The power module includes two chips: a first chip 1a and a second chip 1b, each of which includes the half-bridge circuit. The SW terminal of the first chip 1a is connected to the first winding 22a of the inductor 22, and the SW terminal of the second chip 1b is connected to the second winding 22b of the inductor 22. Both the first winding 22a and the second winding 22b vertically pass through the same window of the inductor 22 from the upper surface of the inductor 22 to the lower surface of the power module and are electrically connected to the connection pins 6 of the power module, thereby forming a multi-phase buck positive coupled circuit. This embodiment is also different from the foregoing embodiments in that a window direction of the magnetic core of the inductor in each of the foregoing embodiments is a horizontal direction, that is, a window axis of the inductor 22 is parallel to the direction of the pin-out surface of the power module, while in the fifth embodiment, the window direction of the magnetic core of the inductor is a vertical direction, that is, the window axis of the inductor is perpendicular to the direction of the pin-out surface of the power module. With the vertical window direction, the magnetic core of the inductor is an integer in the height direction, that is, there is no need to stack a plurality of magnetic blocks, which is more advantageous in reducing the height of the inductor. Due to requirements on intensity, the thickness of the magnetic core needs to be greater than or equal to a minimum thickness limit. If the magnetic core structure of the fourth embodiment is adopted, the thickness of the magnetic core in the height direction will be twice the minimum thickness limit; in contrast, in the fifth embodiment, the thickness of the magnetic core in the height direction can be one time the minimum thickness limit.

Figure 17:
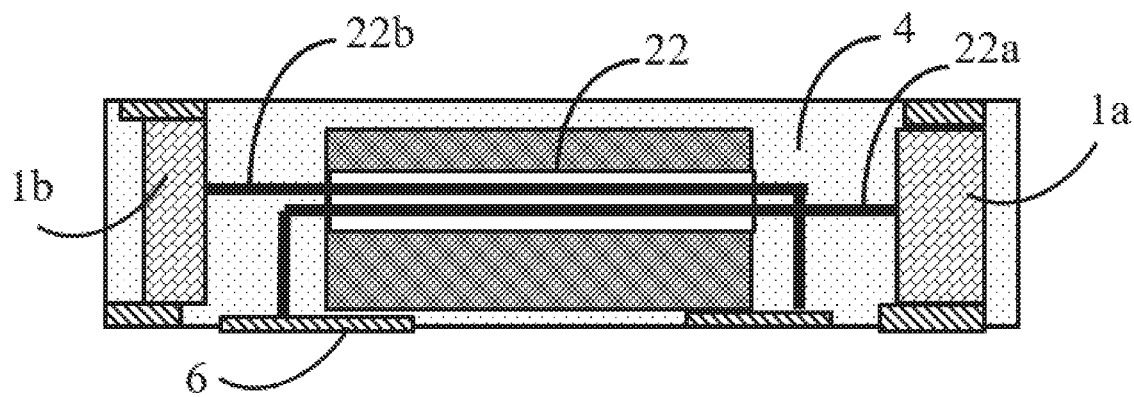
FIG. 17 is a side view of a power module according to a sixth embodiment of the present disclosure.
Figure 18:
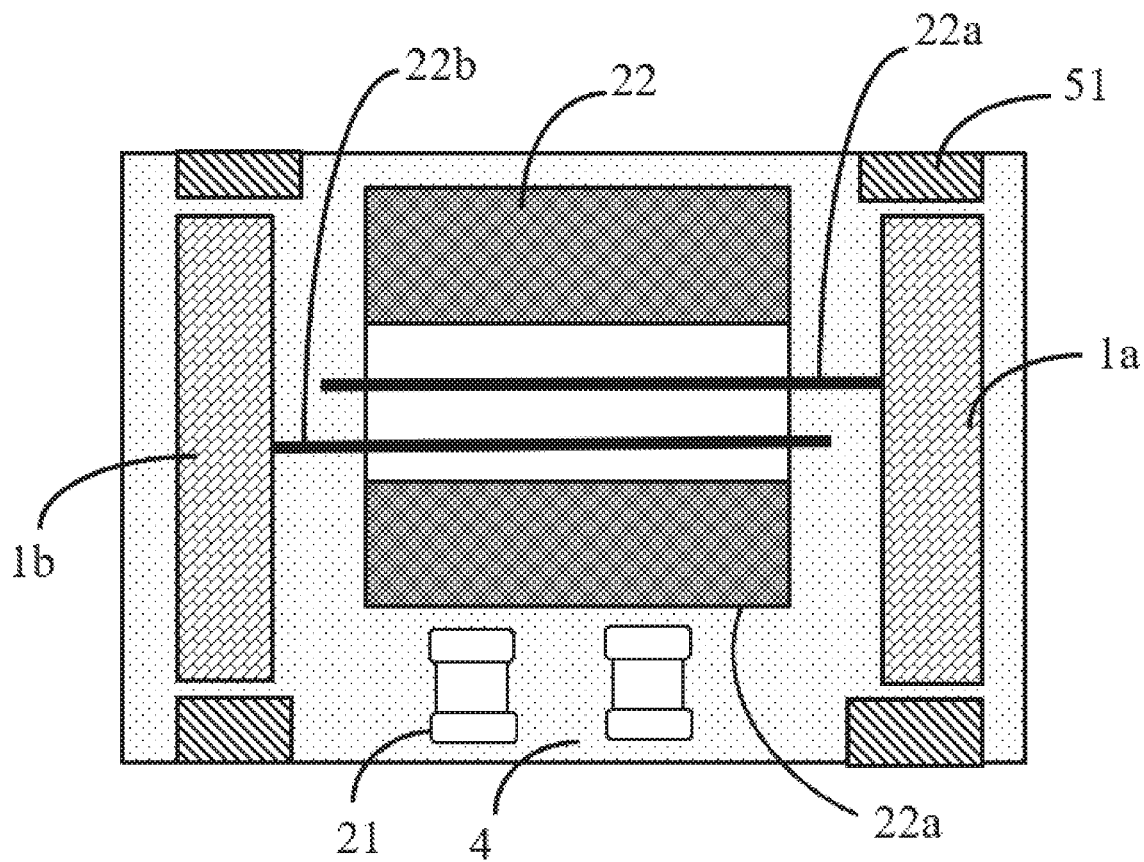
FIG. 18 is a top view of the power module according to the sixth embodiment of the present disclosure.

FIGS. 17 and 18 are schematic structural diagrams of a power module according to a sixth embodiment of the present disclosure. The difference between this embodiment and the fifth embodiment is that the window of the inductor 22 is arranged horizontally, that is, the window axis of the inductor 22 is parallel to the pin-out surface of the power module, the first chip 1a and the second chip 1b are provided at both ends of the window of the inductor 22, respectively, the SW terminal of the first chip 1a is connected to the first winding 22a, and is connected to the connection pin 6 on the left side of the inductor, and the SW terminal of the second chip 1b is connected to the second winding 22b, and is connected to the connection pin 6 on the right side of the inductor. In this embodiment, the passive element further includes a capacitor 21, which may be an input capacitor or an output capacitor. The structure of the power module of this embodiment can constitute a two-phase or multi-phase reversely-coupled power module, for example, a two-phase reversely-coupled buck module, which is of simple and compact structure and good parameter symmetry of the two-phase circuit, and is advantageous in improving the parallel output capability of the multi-phase circuit and dynamics, and is of better power density.

Figure 19:
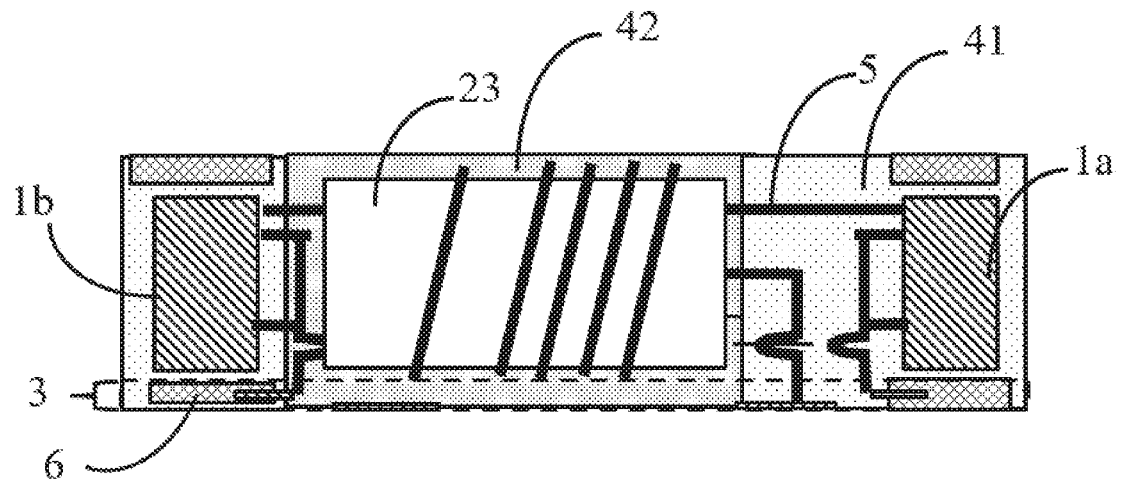
FIG. 19 is a side view of a power module according to a seventh embodiment of the present disclosure.
Figure 20:
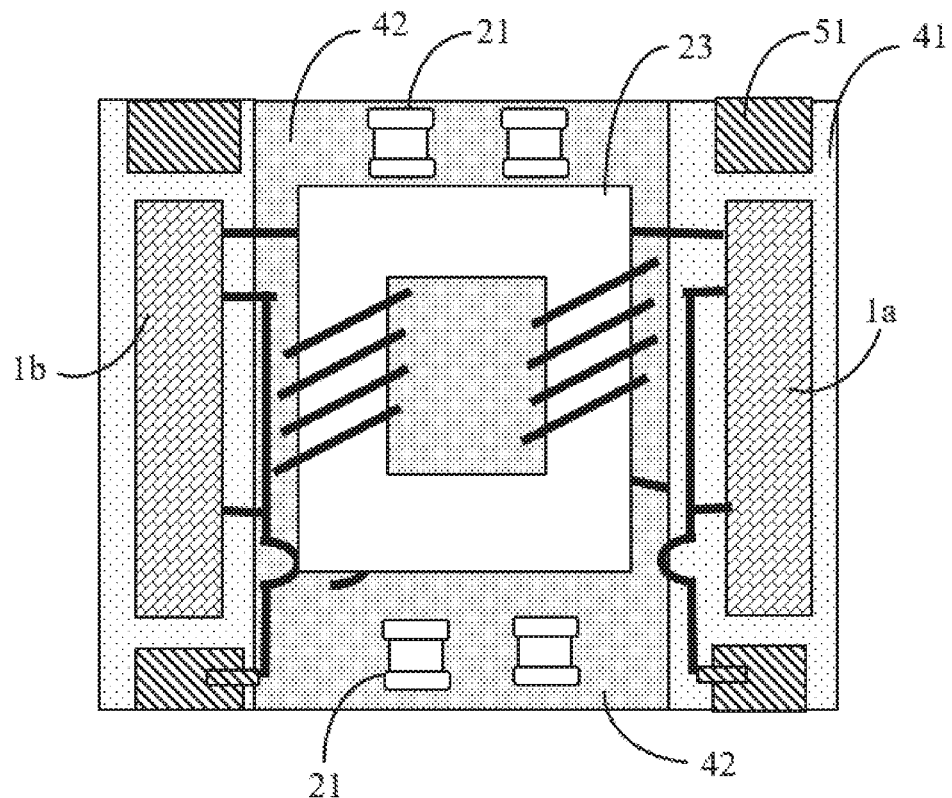
FIG. 20 is a top view of the power module according to the seventh embodiment of the present disclosure.
Figure 53:
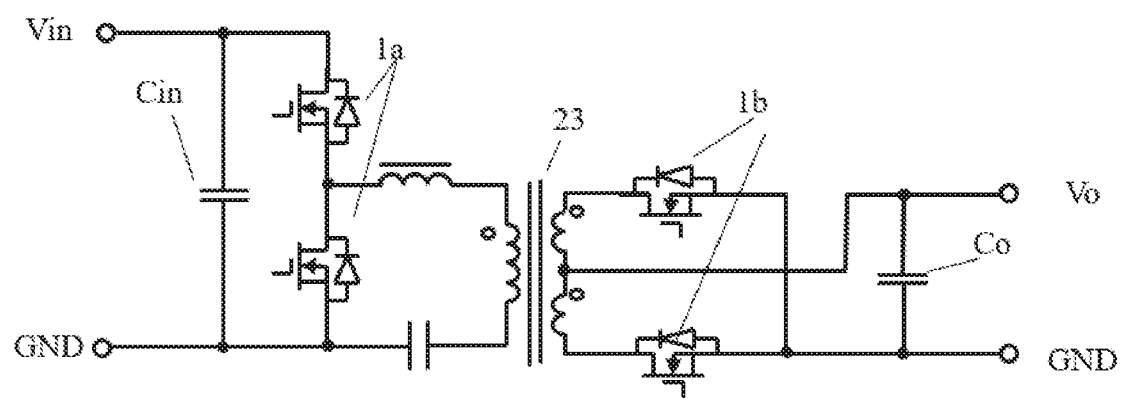
FIG. 53 is a schematic diagram of an LLC circuit according to an embodiment of the present disclosure.

FIGS. 19 and 20 are schematic structural diagrams of a power module according to a seventh embodiment of the present disclosure. The difference between this embodiment and the foregoing embodiments is that the passive element in the power module includes a transformer 23. The chip 1 which is substantially placed vertically and the transformer 23 are tiled in the package body 4. The power module of this embodiment can be configured to form an LLC circuit as shown in FIG. 53, but it is not limited thereto. For example, as for the circuit shown in FIG. 53, the first chip 1a shown in FIG. 19 can be a primary side switching device, and the second chip 1b can be a secondary side switching device. In another implementation, the first chip 1a can be the secondary side switching device, and the second chip 1b can be the primary switching device. The first chip 1a and the second chip 1b are provided on the periphery of the transformer, and in FIG. 19, they are provided on the left and right sides of the transformer 23. In other optional implementations, the chips 1 can be provided on all four sides of the transformer 23 (not shown in the drawing). The transformer 23 can be packaged in an insulating second packaging material 42. The second packaging material 42 for packaging the transformer 23 can be the same as or different from the insulating first packaging material 41 around the chip 1. In some implementations, the first packaging material 41 used for packaging the power module can be FR4, ABF or other packaging materials for embedded process, and the second packaging material 42 used for packaging the transformer 23 can be various molding material, and the packaging can be performed by using the molding process. Accordingly, the insulating packaging material in the connection layer 3 can be composed of multiple materials. In some other implementations, the first packaging material 41 can also be various molding compounds, and the second packaging material for packaging the transformer 23 can also be FR4, ABF, or other packaging materials for the embedded process. As such, a variety of packaging processes can be used flexibly, which is advantageous in structural optimization and cost reduction. In addition, the connection layers can be provided between the upper surface of the power module and the chip and between lower surface of the power module and the chip, that is, forming two connection layers, which is convenient for tracing between the chip and the upper and lower surfaces of the power module, and the connection pins can be provided on both the upper and lower surfaces of the package body.

This embodiment can be implemented by using various processes. For example, the transformer 23 can be packaged with the second packaging material 42 first, and then packaged with the chip again. Alternatively, the first chip 1a and the second chip 1b provided on the left and right sides are formed in the package substrates, respectively, the package substrates are welded to the transformer in the middle, and then the insulating packaging material is molded between the left and right packaging substrates. Alternatively, the transformer 23 can be packaged with the second packaging material 42 first, with terminals provided on two sides or multiple sides, and the first chip 1a and the second chip 1b on the left and right sides are formed in the package substrates, respectively, with the terminals provided on the surfaces, and then the left and right sides of the package body formed by the transformer 23 are welded through the terminals to respectively connect the package substrates formed by the first chip 1a and the second chip 1b on the left and right sides, thereby forming the final power module. Of course, when it is fabricated in a panel manner, the final power module can be formed by cutting, and if necessary, other post-processing, such as cleaning or forming an anti-oxidation layer, can be performed. This structure can be used for forming the power module including the transformer with a small height and high efficiency, such as the power module of the circuit shown in FIG. 52 or FIG. 53. In addition, the connection layer 3 in this embodiment can be implemented in various processes, which is simple, flexible, and convenient for application. The transformer 23 in FIGS. 19 and 20 is a foil-wound transformer, which facilitates formation of a structure of small volume and high current. In another embodiment, the transformer can be a planar transformer, similar to the transformer in FIG. 21, the tracings in the PCB can be used as the windings, and the PCB is provided with holes for mounting the magnetic core.

Figure 21:
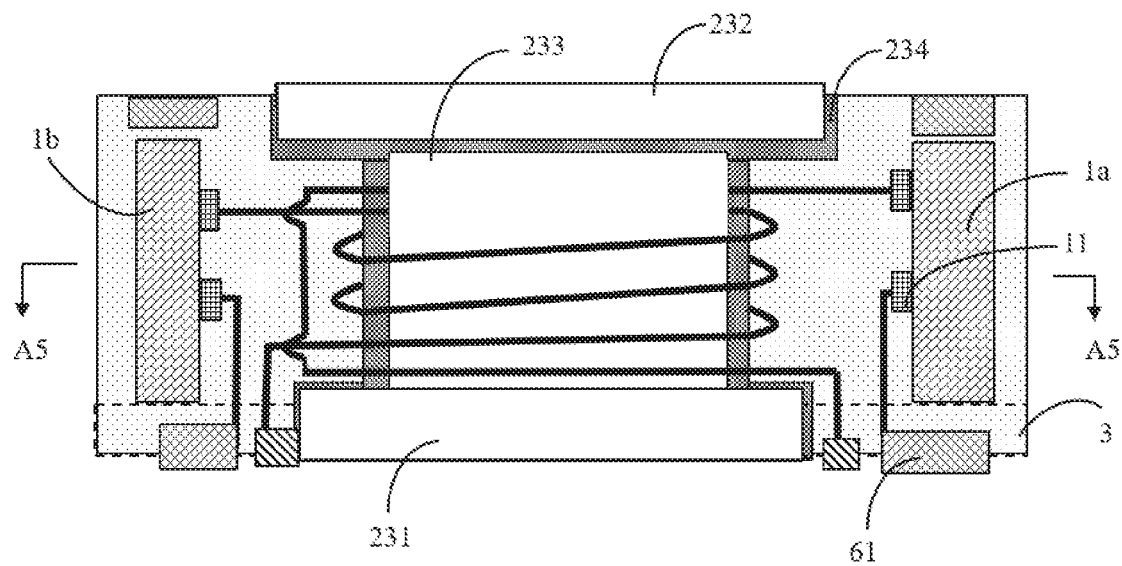
FIG. 21 is a side view of a power module according to an eighth embodiment of the present disclosure.
Figure 22:
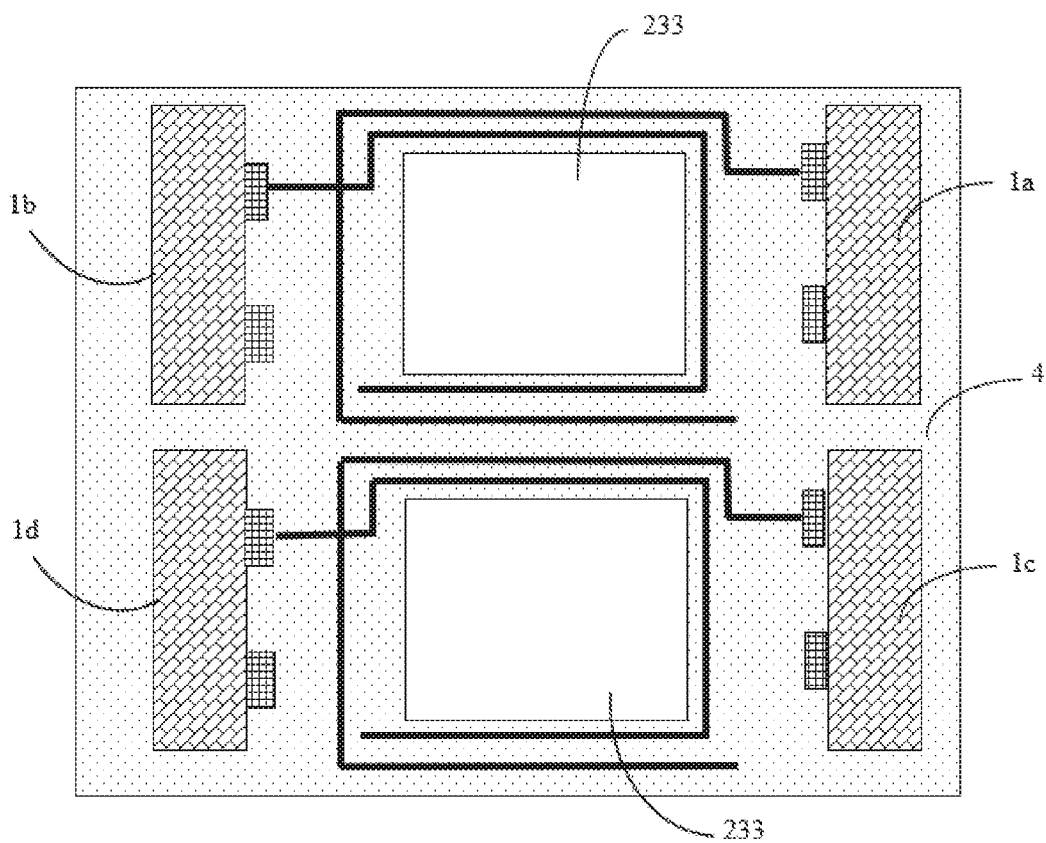
FIG. 22 is a top view of the power module according to the eighth embodiment of the present disclosure.

FIGS. 21 and 22 are schematic structural diagrams of a power module according to an eighth embodiment of the present disclosure. The difference between this embodiment and the seventh embodiment is that the primary winding and the secondary winding of the transformer 23 can be formed in the insulating packaging material 4 first, similar to the planar transformer which can be formed for example in PCB process, and then are electrically connected to the embedded chips 1 which are vertically arranged. After a mounting slot 234 is formed in the package body, the magnetic pillar 233 is placed in the mounting slot 234 so that the winding is sleeved on the magnetic pillar 233, and finally a complete transformer 23 and a complete power module are formed. There may be two or more magnetic pillars 233, and a first cover plate 231 and a second cover plate 232 are connected to the plurality of magnetic pillars 233 to form a closed magnetic loop. The magnetic pillar 233, the first cover plate 231, and the second cover plate 232 are all made of magnetic materials, or the magnetic pillar 233 can be integrated with one of the cover plates 231 or 232 in advance, that is, the windings of the transformer can be packaged with the first chip 1a and the second chip 1b in advance with a window for installing the magnetic pillar 233 reserved, and the magnetic pillar 233 is placed into the window to form the power module. In this way, it is possible to prevent the magnetic material from being embedded in the packaging material 4 and to prevent the magnetic material from being subjected to stress which will affect the efficiency or reliability. Moreover, the structure is simple and compact, and the power density is high. In some implementations, the transformer 23 in FIGS. 21 and 22 can also be a coupled inductor or a foil-wound transformer, or the transformer 23 can be replaced with the inductor 22 formed in a similar manner.

Figure 23:
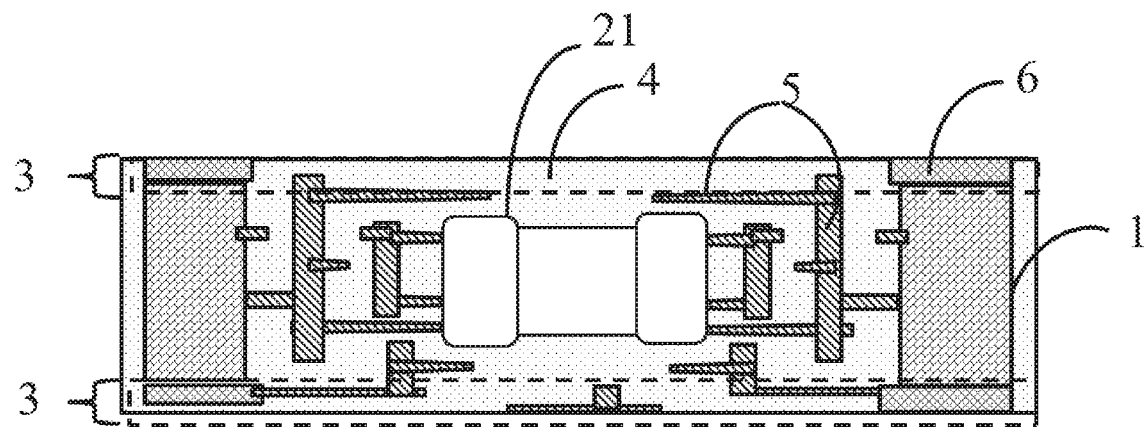
FIG. 23 is a side view of a power module according to a ninth embodiment of the present disclosure.
Figure 24:
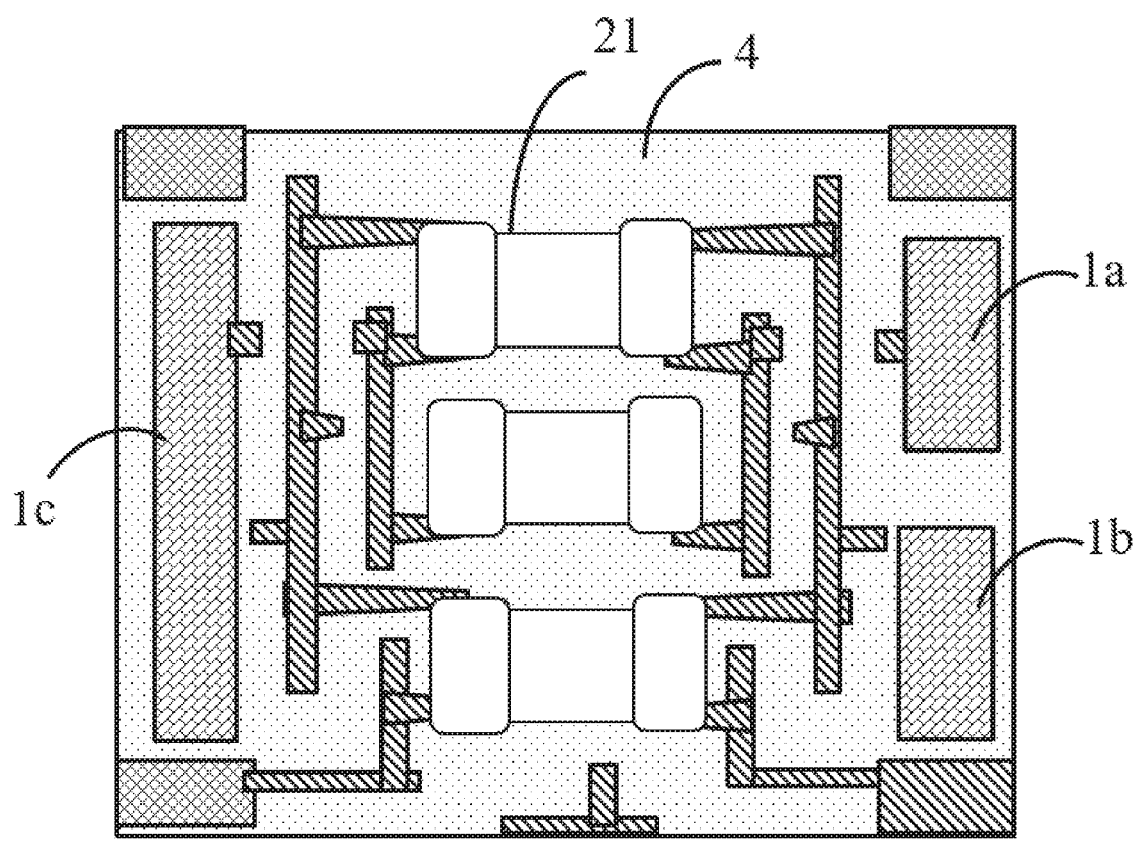
FIG. 24 is a top view of the power module according to the ninth embodiment of the present disclosure.
Figure 54:
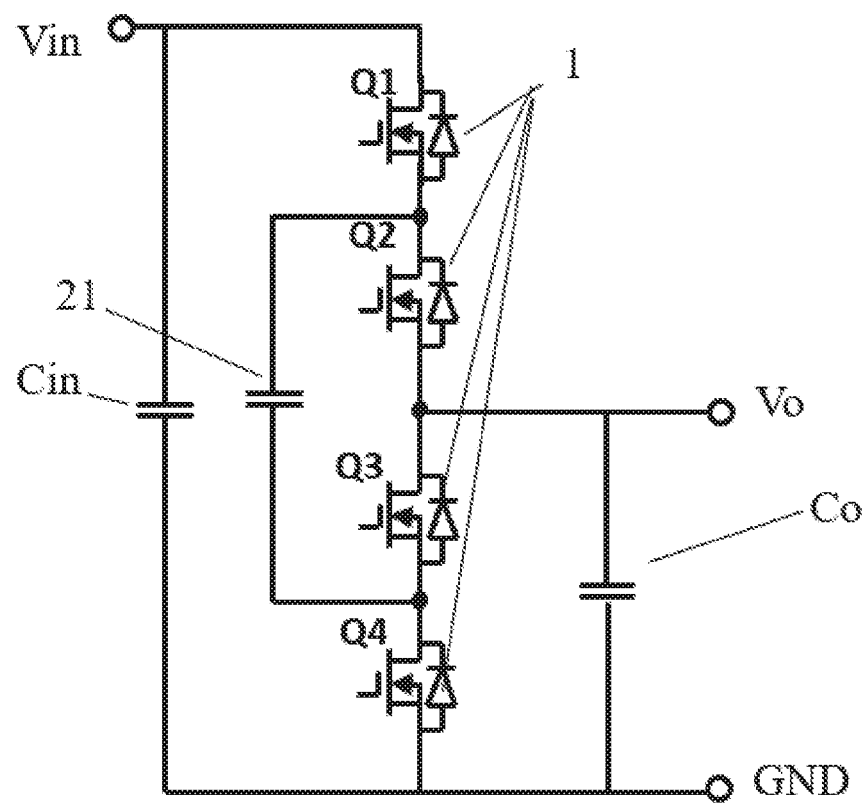
FIG. 54 is a schematic diagram of a switching capacitor circuit according to an embodiment of the present disclosure.

FIGS. 23 and 24 are schematic structural diagrams of a power module according to a ninth embodiment of the present disclosure. In this embodiment, the passive element includes capacitors 21, and the chips 1 and the capacitors 21 are tiled. The capacitors 21 can be discrete devices or an entire capacitor board, and the plurality of chips are arranged around the capacitors 21. Alternatively, the capacitors are arranged around the chips. Alternatively, the chips 1 and the capacitors 21 are alternately arranged at intervals. The power module of such structure can be used to implement some circuits with special topologies, such as a switching capacitor circuit. There are many specific topologies for the switching capacitor circuit, and one of them is shown in FIG. 54. Description will be given below for the topology of FIG. 54 as an example. The capacitor in the ninth embodiment can be the capacitor 21 in FIG. 54, or an input capacitor Cin or an output capacitor Co therein. Switches Q1-Q4 in FIG. 54 can be implemented by the first chip 1a, the second chip 1b, or the third chip 1c in the ninth embodiment. For example, the first chip 1a includes the switch Q1, the second chip 1b includes the switch Q2, the third chip 1c includes the switch Q3 and the switch Q4, and the switch Q3 and the switch Q4 are connected in series to form a half-bridge structure. The capacitor 21 in FIG. 24 can be the capacitor 21 in FIG. 541 and the first chip 1a, the second chip 1b, and the third 1c are electrically connected to the capacitor 21 through the line layer 5. In the case where the switch Q1 and the switch Q2 are implemented by the same chip, the power module of this embodiment can include two chips. In the case where the switches Q1-Q4 are implemented by separate chips, four chips can be included inside the module in this embodiment. That is to say, the number of chips in the module is related to the way in which the switching devices are implemented in the topology of the circuit. With this embodiment, the switching capacitor power module can be formed. By selecting the capacitors with a height corresponding to the length or width of the terminal-out surface of the chips, a high space utilization rate can be achieved. When the height of the module is comparative to the height of the capacitor, the footprint and the volume of the module are reduced due to the vertically arranged chips, and the power density of the power module is increased.

The connection layer 3 in FIG. 23 can be located between the chips and the lower surface of the power module, or between the chips and the upper surface of the power module. Here, as an example, description will be given in the case where the connection layer 3 is located between the chips and the lower surface of the power module, i.e., within a range shown in a dotted box in FIG. 23. The connection layer 3 includes horizontal metal distribution layers and a connection structure between the distribution layers, similar to the tracing layer in the PCB. The metal distribution layers in the connection layer 3 (which is also similar to the tracings in the PCB or tracings formed by metallization methods such as electroplating) are arranged in a direction parallel to the lower surface of the power module. As can be seen from FIG. 23, the line layer 5 includes the metal distribution layers in the vertical direction and the connection structure between the distribution layers. Specifically, the metal distribution layers in the line layer 5 can be arranged in a direction parallel to the terminal-out surface of the chips 1, that is, in a direction perpendicular to the pin-out surface of the power module. Due to different manufacturing processes, the cross-section of the metal distribution layer is usually a square or rectangular structure, and the connection structure between the distribution layers is usually manufactured in a process such as vias, so the cross-sectional structure is generally a truncated cone shape. The metal distribution layers in the line layer 5 and the metal distribution layers in the connection layer 3 can be arranged perpendicular to each other, so as to achieve a structure in which the tracings in the same package module are disposed perpendicularly to each other as a whole, which is advantageous in achieving more complicated tracing arrangement, and improving the power density of the system and the efficiency of the power module.

Figure 25:
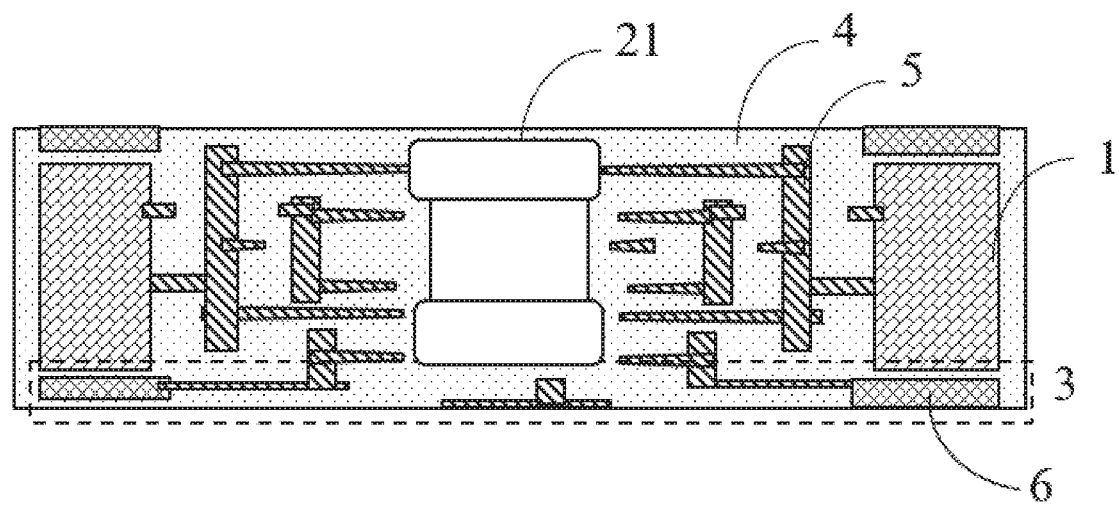
FIG. 25 is a side view of a power module according to a tenth embodiment of the present disclosure.
Figure 26:
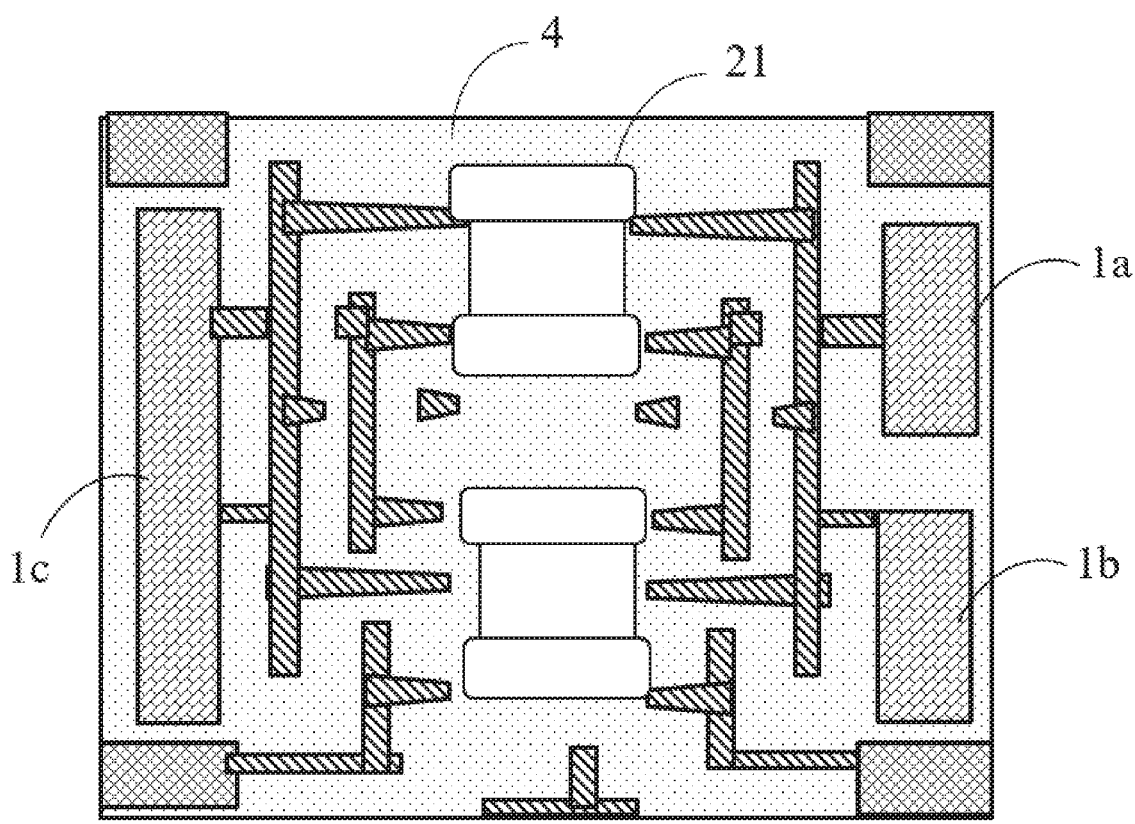
FIG. 26 is a top view of the power module according to the tenth embodiment of the present disclosure.

FIGS. 25 and 26 are schematic structural diagrams of a power module according to a tenth embodiment of the present disclosure. The difference between this embodiment and the ninth embodiment is that the capacitor 21 in the power module can be erected, that is, the length direction of the capacitor (that is, a direction of the largest dimension in the three-dimensional size of the capacitor) is perpendicular to the pin-out surface of the power module. For example, for the capacitor in a small package, the height of the capacitor is much smaller than that of the chip, and the capacitor can be erected to match the height of the chip. Such arrangement can reduce the footprint of the power module and increase the power density. In addition, in some other alternative implementations, two poles of the erected capacitor can be more easily connected to the terminals of the chips 1, reducing the lengths of the connection lines and reducing the resistance and parasitic inductance of the power module.

Figure 27:
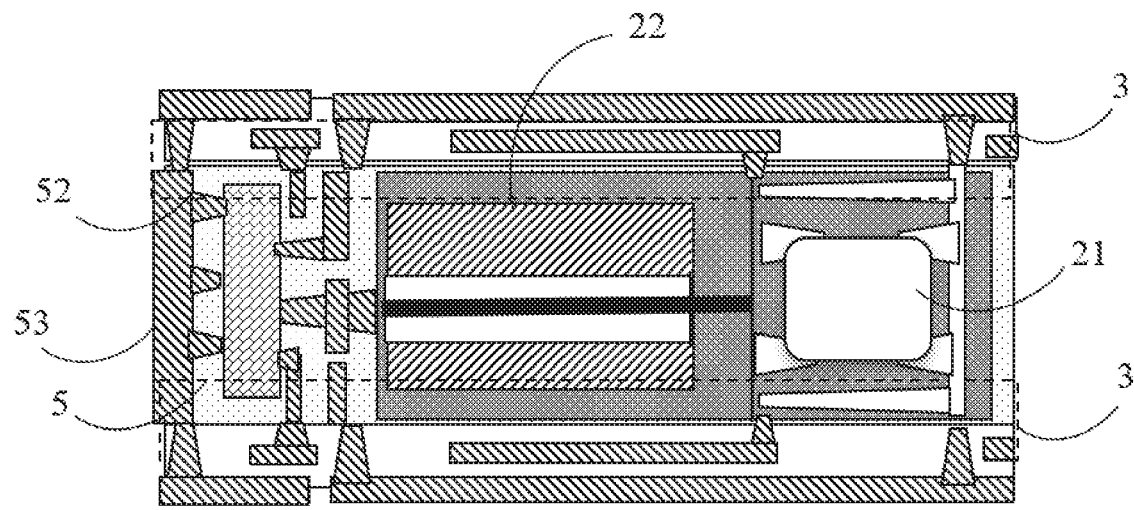
FIG. 27 is a side view of a power module according to an eleventh embodiment of the present disclosure.

FIG. 27 is a side view of a power module according to an eleventh embodiment of the present disclosure. This embodiment differs from the previous embodiments in that a conductive line 53 is further provided on the back surface of the chip 1 (a surface opposite to the terminal-out surface). The conductive line 53 can be in contact with the back surface of the chip 1 through a conductive via 52 and can be exposed at the edge of the power module, for example, on the left side of the power module in FIG. 27. In this way, the heat of the chip 1 can be quickly conducted to the surface of the power module, which is beneficial to the heat dissipation of the chip 1. In some alternative implementations, the conductive line 53 can be in contact with the back surface of the chip 1 and connected to the surface of the power module through the conductive via 52, which facilitates conduction of the heat of the chip 1 to the surface.

Figure 28:
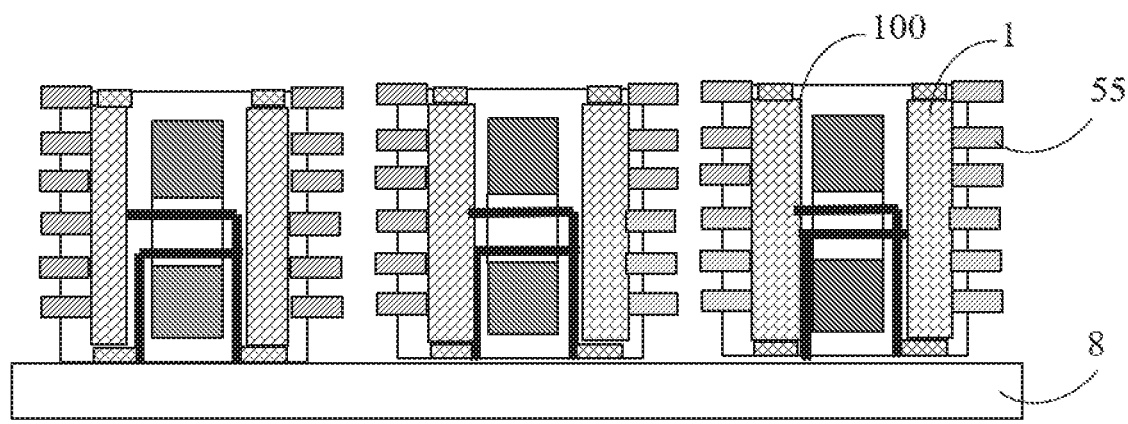
FIG. 28 is a side view of a power module according to a twelfth embodiment of the present disclosure.

FIG. 28 is a schematic structural diagram of a power module according to a twelfth embodiment of the present disclosure. The difference between this embodiment and the previous embodiments lies in that copper pillars 55 can be further provided on the surface of the power module. The copper pillar 55 can increase the surface area and facilitate heat dissipation. For example, the power module shown in FIG. 28 can be welded to a circuit board 8 and then cooled by blowing air, or the power module can be immersed in an insulating coolant to accelerate heat dissipation, and the coolant can be circulated to further increase the heat dissipation rate.

Figure 29:
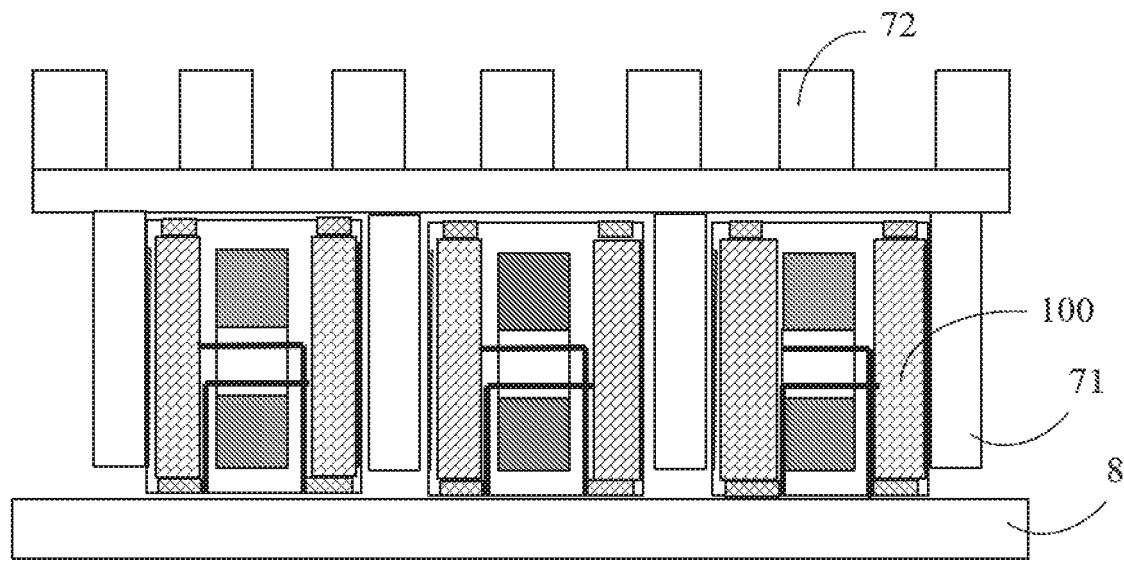
FIG. 29 is a side view of a power module according to a thirteenth embodiment of the present disclosure.

FIG. 29 is a schematic structural diagram of a power module according to a thirteenth embodiment of the present disclosure, which shows a structure in which a plurality of power modules are welded to a circuit board 8 and thermal conductive plates 71 are provided between the power modules. The thermal conductive plate 71 can be in contact with the adjacent power module(s). A thermal grease or a thermal pad can be provided between the thermal conductive plate 71 and the power module to facilitate heat conduction. The thermal conductive plate 71 is in contact with the heat dissipator 72. The heat is transferred to air or other heat dissipation medium through the heat dissipator 72.

Figure 30:
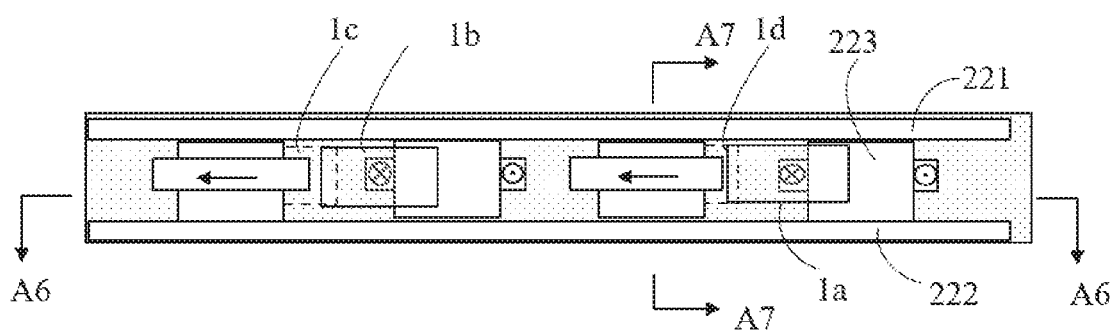
FIG. 30 is a side view of a power module according to a fourteenth embodiment of the present disclosure.
Figure 31:
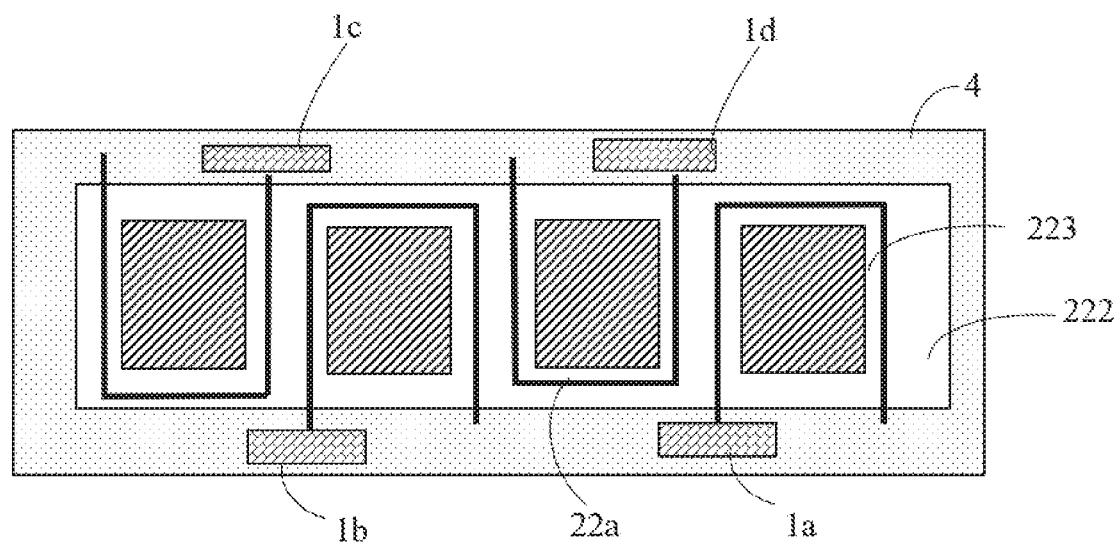
FIG. 31 is a cross-sectional view in a direction of A6-A6 in FIG. 30.
Figure 32:
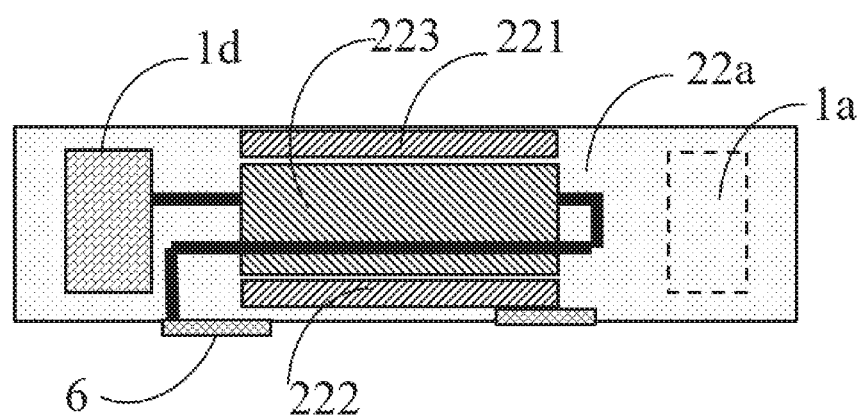
FIG. 32 is a cross-sectional view in a direction of A7-A7 in FIG. 30.

FIGS. 30 to 32 are schematic structural diagrams of a power module according to a fourteenth embodiment of the present disclosure. The difference between this embodiment and the previous embodiments is that the passive element includes an inductor 22 which is a multiphase reversely-coupled inductor, such as a four-phase reversely-coupled inductor 22 shown in FIGS. 30-32. The power module includes four chips: a first chip 1a, a second chip 1b, a third chip 1c, and a fourth chip 1d, and each of the chips includes a serially connected half-bridge structure. The inductor 22 includes four middle pillars 223 arranged side by side, one upper side pillar 221 and one lower side pillar 222. One end of each of the middle pillars 223 is connected to the upper side pillar 221, and the other end is connected to the lower side pillar 222. Each middle pillar 223 is provided with a winding 22a, and one end of each winding 22a is electrically connected to the SW terminal of one chip. The middle pillar 223 corresponding to each of the windings 22a is vertically arranged, and pin of the winding 22a is led out after being wound back to the side of the corresponding chip, that is, the other end of each winding 22a is electrically connected to the connection pin 6 of the power module. The chips 1a, 1b, 1c, 1d are substantially placed vertically and are tiled with the inductor 22. The chips 1a, 1b, 1c, 1d are alternately arranged on both sides of the inductor 22, in other words, the chips electrically connected to the adjacent windings 22a are arranged on different sides of the multiphase reversely-coupled inductor, such as opposite sides. For example, the first chip 1a and the second chip 1b are provided on one side of the inductor 22, and the third chip 1c and the fourth chip 1d are provided on the other side of the inductor 22. In FIG. 30, on the left side of the center pillar 223 corresponding to each of the winding 22a, an symbol "x" in a circle is marked, indicating that the current is transmitted inwards perpendicularly to the paper plane, and on the right side of the center pillar 223 corresponding to each of the winding 22a, a dot symbol in a circle is marked, indicating that the current is transmitted outwards perpendicularly to the paper plane. With this embodiment a multiphase reversely-coupled power module can be implemented, which can achieve higher power density and higher dynamic performance, and the chips are directly connected with the windings of the inductor, which shortens the connection distance between the chips and the inductor, and is advantageous in achieving higher efficiency.

Figure 33:
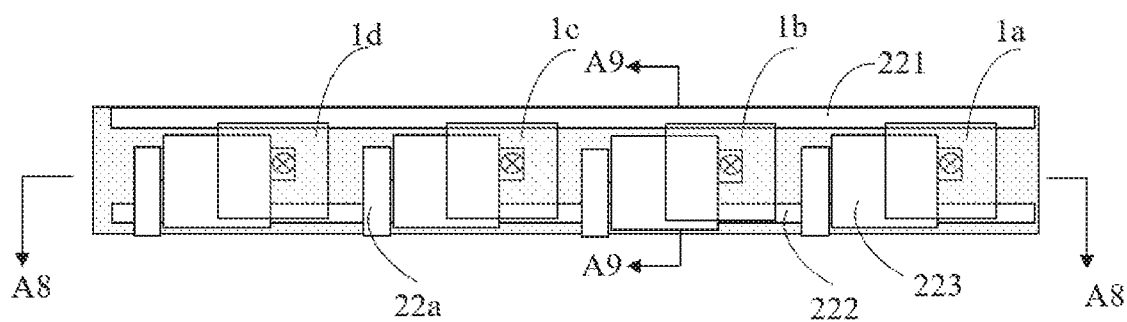
FIG. 33 is a side view of a power module according to a fifteenth embodiment of the present disclosure.
Figure 34:
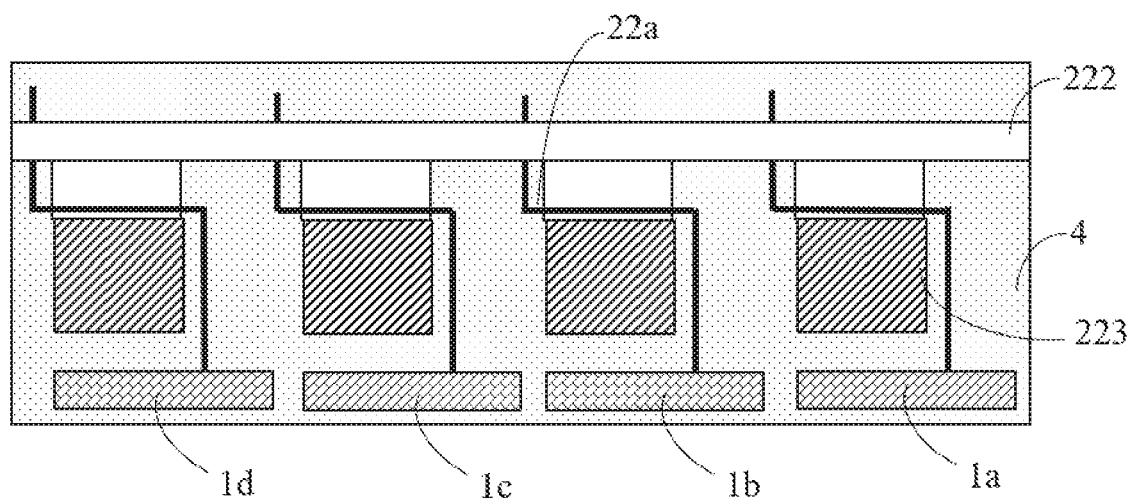
FIG. 34 is a cross-sectional view in a direction of A8-A8 in FIG. 33.
Figure 35:
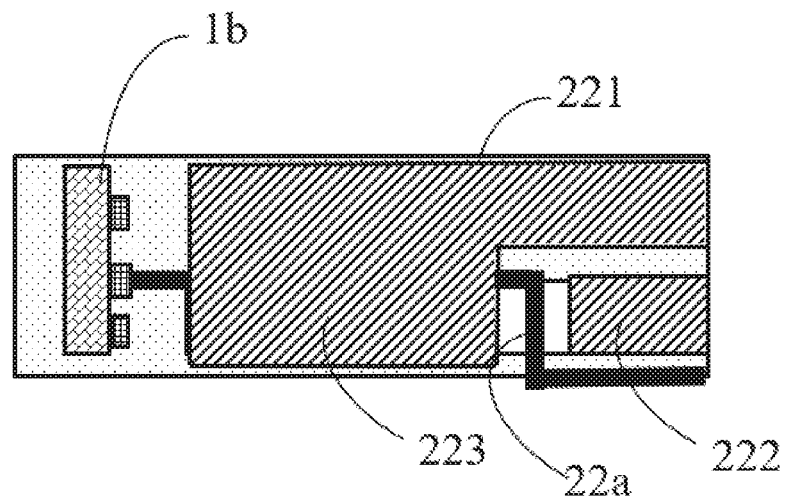
FIG. 35 is a cross-sectional view in a direction of A9-A9 in FIG. 33.

FIGS. 33 to 35 are schematic structural diagrams of a power module according to a fifteenth embodiment of the present disclosure. This embodiment differs from the fourteenth embodiment in that the four chips 1a, 1b, 1c, 1d are arranged on the same side of the inductors 22. One end of the winding of each inductor 22 is electrically connected to the corresponding chip on one side of the inductor 22, and the other end can be led out from the other side of the inductor 22 and connected to the connection pin 6 of the power module. Each of the middle pillars 223 is horizontally arranged, one end thereof is connected to the upper side pillar 221, and the other end is connected to the lower side pillar 222. Each winding is bent around the corresponding middle pillar 223 below the upper side pillar 221 and above the lower side pillar 222 to bypass the corresponding middle pillar 223, and then is led out below the lower side pillar 222 and on the opposite side of the corresponding chip, that is, the other end of each winding is electrically connected to the connection pin 6 of the power module. This structure is more convenient for application by the user, is simple and compact, and has the advantages of facilitating higher power density and higher dynamic performance. Further, the chips are directly connected with the windings of the inductor, which shortens the connection distance between the chips and the inductor, and is advantageous in achieving higher efficiency.

The present disclosure also provides a method for manufacturing a power module. The method includes the following steps:

in S100: stacking and packaging passive elements and chips in a first packaging material, so that an angle between terminal-out surfaces of the chips and a stacking direction of the first packaging material is greater than 45° and less than 135°, a first redistribution layer is formed on one side of the chips or the passive elements, and the passive elements are electrically connected to chip terminals of the chips, to form a power module panel; and in S200: cutting the power module panel along a first cutting plane to form a plurality of power modules, forming connection pins by conductive portions which are exposed after the cutting, and forming a first connection layer between a pin-out surface of each of the power modules and the chip of the power module, the first connection layer being configured to electrically connect the connection pins to at least one of the chip terminal of the chip and the passive element of the power module.

In such formed power module, a projection of the chip on the pin-out surface of the power module does not overlap with a projection of the passive element on the pin-out surface of the power module, and an angle between the terminal-out surface of the chip and the pin-out surface of the power module is greater than 45° and less than 135°.

Accordingly, in the power module obtained by the method for manufacturing the power module according to the present disclosure, since the chip and the passive element are tiled, it is easier to realize the power module with a small height compared with the stacked structure. Since the chip is basically arranged vertically, the connection between the chip and the passive element is more direct, which can reduce current impedance and loss or parasitic inductance; and since the chip is basically arranged vertically, it is advantageous in reducing the footprint of the power module and making the structure more compact and the power density higher.

The specific implementations of the method for manufacturing the power module in several specific embodiments are described in detail below in conjunction with FIGS. 36 to 48.

FIG. 36 to FIG. 40 are schematic diagrams of processes of a method for manufacturing a power module according to the present disclosure.

Figure 36:
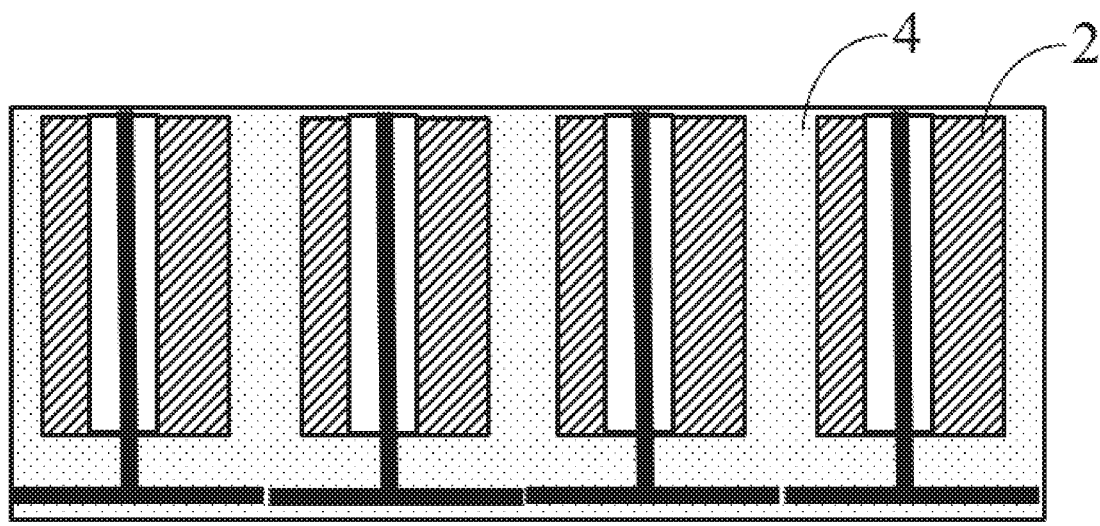
FIG. 36 is schematic diagram of a process of a first step of a method for manufacturing a power module of the present disclosure.
Figure 37:
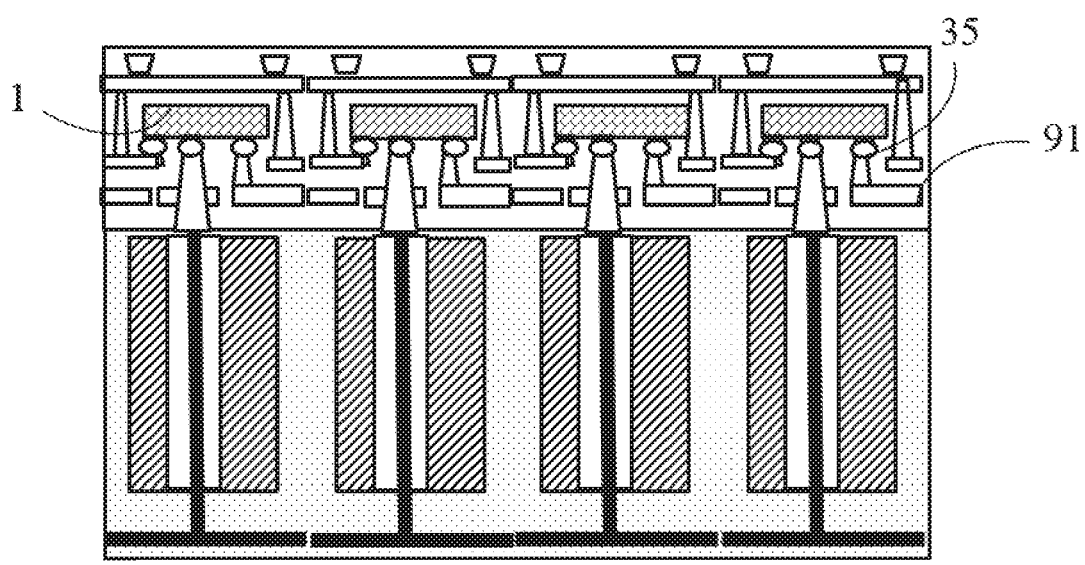
FIG. 37 is a schematic diagram of a process of a second step of a method for manufacturing a power module of the present disclosure.
Figure 38:
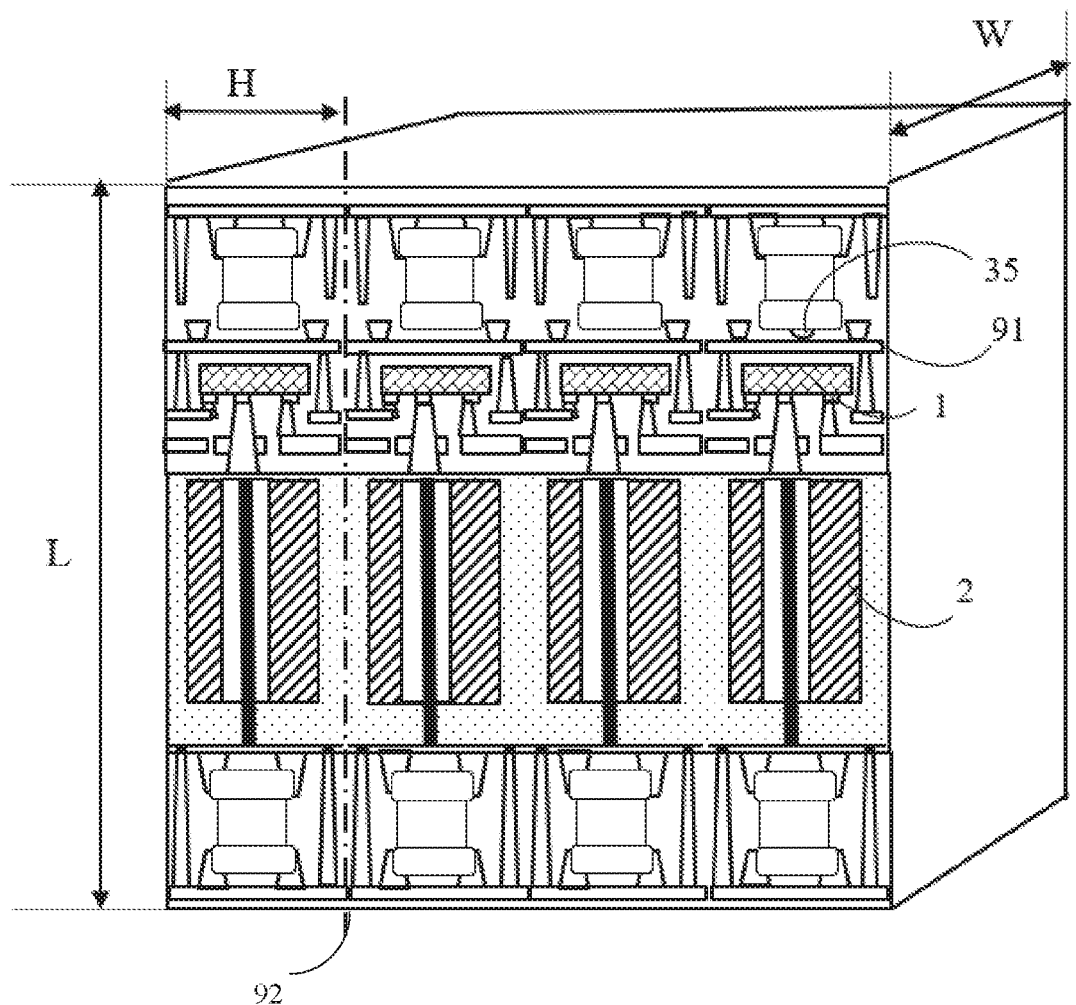
FIG. 38 is a schematic diagram of a process of a third step of a method for manufacturing a power module of the present disclosure.

In this embodiment, as shown in FIGS. 36 to 38, which correspond to the specific implementations of the above S100, the passive element 2 is embedded in the insulating packaging material 4 first as shown in FIG. 36, and the passive element 2 can be an inductor, a capacitor or another passive element. In addition, it is possible to arrange and embed an array of multiple passive elements to form the panel. As shown in FIG. 37, one or more first redistribution layers 91 are then formed on the surface of the panel in which the passive element is embedded, and the chip 1 is embedded. The chip 1 can be welded to the first redistribution layer 91 in a flipped manner. For example, the chip 1 is welded to the first redistribution layer 91 through the welding spot 35 in FIG. 37, so that the angle between the terminal-out surface of the chip and the direction in which the first packaging material is stacked is greater than 45° and less than 135°, for example, is 90°. Then it is possible to continue to form other redistribution layers or embed other passive elements or other chips on the surface of the panel, and the other devices such as capacitors can also be welded to the corresponding welding spots, as shown in FIG. 38. The first redistribution layer 91 formed here can serve as the connection layer 3 or the line layer 5 in the power module.

Figure 39:
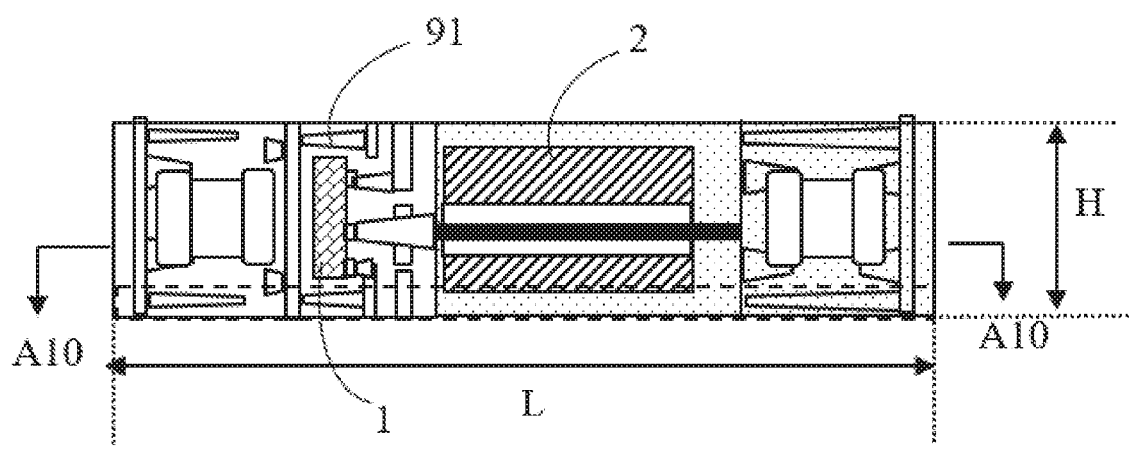
FIG. 39 is a side view of a single power module formed by cutting in a method for manufacturing a power module of the present disclosure.
Figure 40:
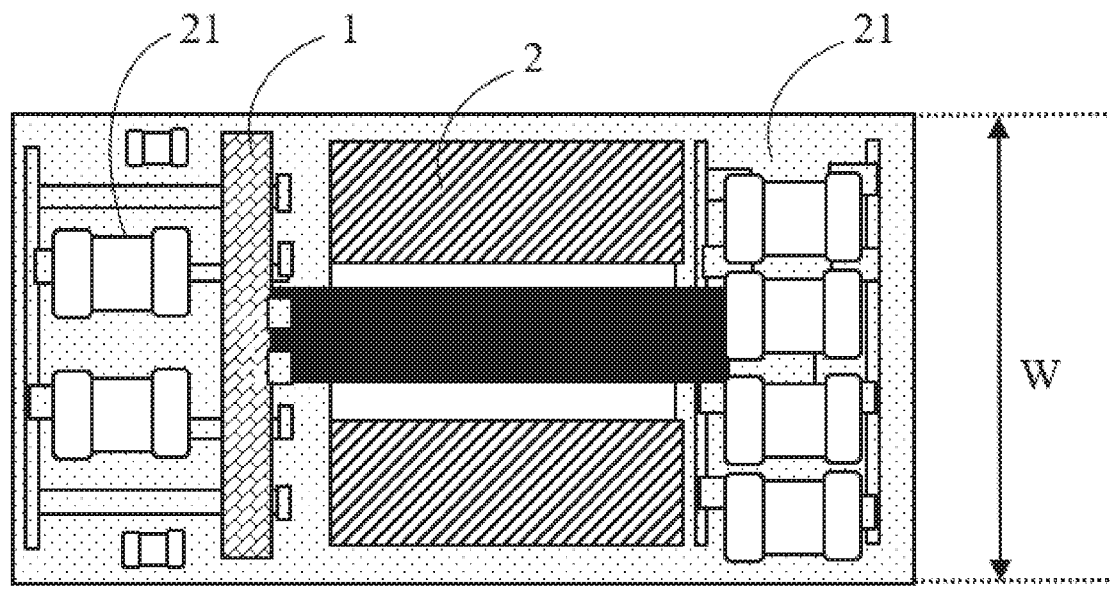
FIG. 40 is a cross-sectional view in a direction of A10-A10 in FIG. 39.

Then, the specific implementation of the step S200 is performed, that is, the panel is cut into individual modules along the cutting plane 92, and the conductive portions exposed after the cutting form the connection pins. A connection layer is formed between the pin-out surface of the power module and the chip 1, and the connection layer is configured to electrically connect the connection pin to at least one of the chip terminal of the chip and the passive element. FIG. 39 illustrates a side view of a single power module formed by step S200, and FIG. 40 illustrates a cross-sectional view in the direction A10-A10 in FIG. 39. In other alternative implementations, in step S100, the chip may be embedded first, and then the passive element may be embedded, or the chip and the passive element may be embedded at the same time, and it is possible to continue to embed other chips. By using this manufacturing method, a power module in which the chip is basically arranged vertically and the chip and other passive elements are tiled can be easily realized, and the spatial three-dimensional arrangement of the circuits in the module can be easily realized, the process is simple, and the cost of the module is reduced.

Figure 41:
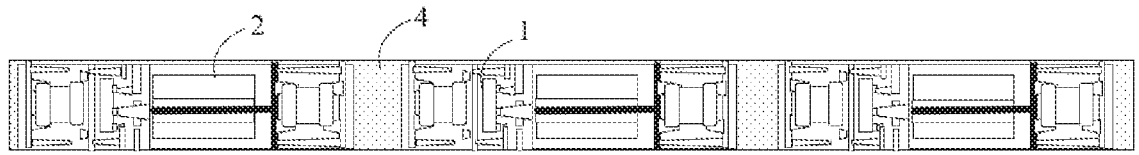
FIG. 41 is a schematic diagram of a process of a fourth step of a method for manufacturing a power module of the present disclosure.
Figure 42:
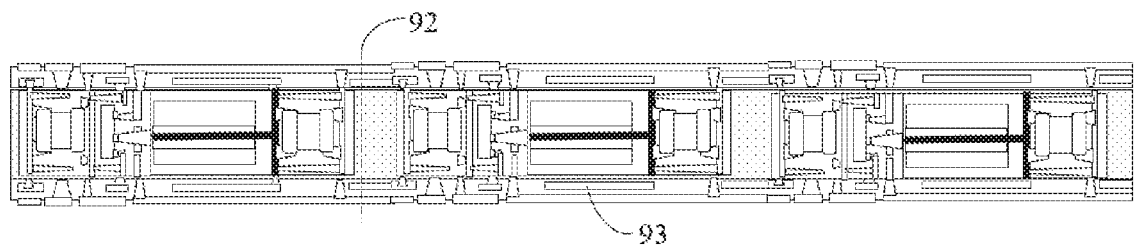
FIG. 42 is a schematic diagram of a process of a fifth step of a method for manufacturing a power module of the present disclosure.
Figure 43:
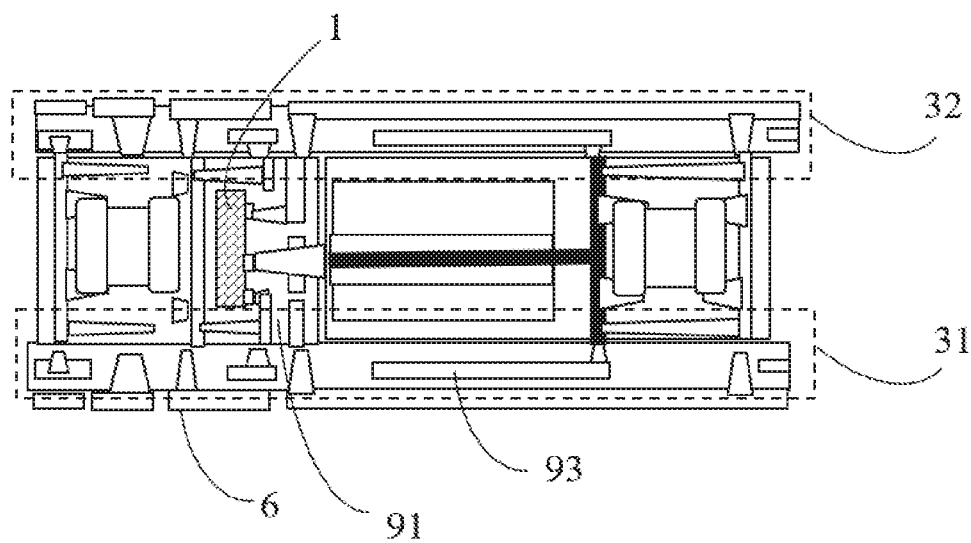
FIG. 43 is a side view of a single power module in FIG. 42.

FIG. 41 illustrates proceeding with step S300 based on step S200. As shown in FIG. 41, the plurality of power modules as shown in FIG. 39 are embedded in the insulating packaging material 4. Then, as shown in FIG. 42, a second redistribution layer 93 is formed on the lower side of the power modules shown in FIG. 41. The second redistribution layer 93 electrically connects the first redistribution layer 91 to the connection pins on the lower surface of the power modules shown in FIG. 42, or perform interconnections between different tracings of the first redistribution layer 91. The panel is then cut into individual modules along the cutting plane 92. FIG. 43 illustrates a side view of a single module. Here, the second redistribution layer 93 can also serve as the connection layer 3 or the line layer 5 in the power module. In this embodiment, the first redistribution layer 91 and the second redistribution layer 93 below the chip 1 form the connection layer 31 similarly, the connection layer 32 may also be formed above the chip 1. In addition, in some implementations, the second redistribution layer can also be formed on the upper surface of the panel in step S300, so that multilayer interconnection of the circuit can be realized, which is advantageous in improving the efficiency and dynamic performance of the power module. The connection pins can also be provided on the upper surface to realize the power module with the connection pins on both sides, which is also advantageous in conducting the heat of the chip or other devices to the upper surface to facilitate heat dissipation. The process shown in FIGS. 41 to 43 can be used to implement free arrangement of the connection pins 6 of the power module on the lower surface or the upper surface, which is convenient for applications by the user. In addition, a structure with redistribution layers perpendicular to each other can also be realized. For example, the first redistribution layer 91 and the second redistribution layer 93 are perpendicular to each other, so that a more complex spatial three-dimensional circuit network can be easily realized, which facilitates more compact and dense current transmission and facilitates the realization of the power module with higher power density.

Figure 44:
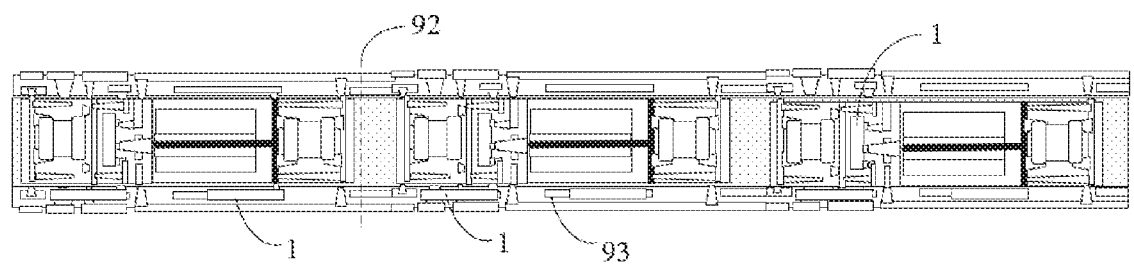
FIG. 44 is a schematic diagram of embedding a chip in a second redistribution layer in a method for manufacturing a power module of the present disclosure.
Figure 45:
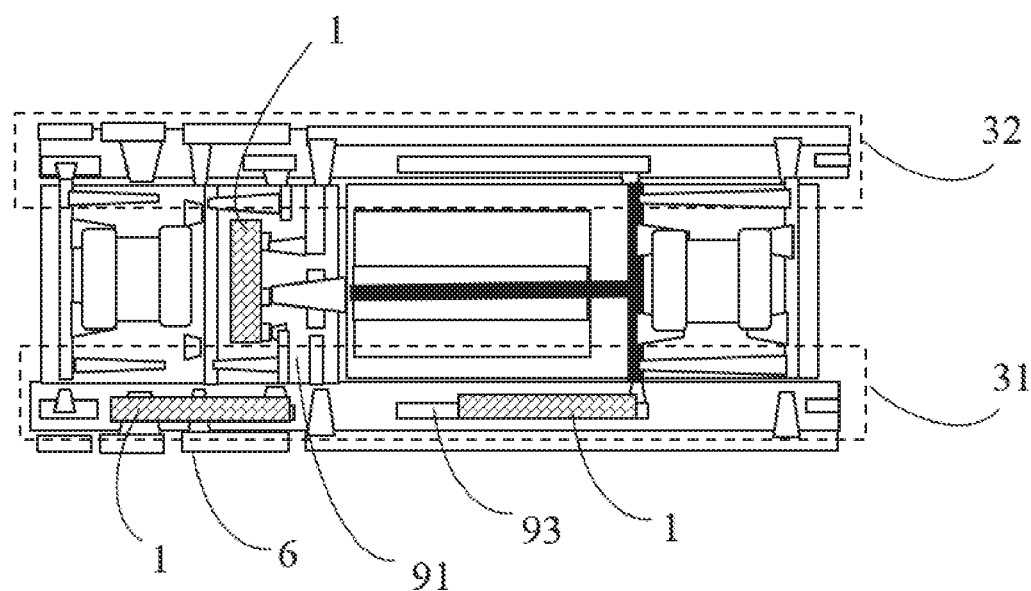
FIG. 45 is a side view of a single power module in FIG. 44.

As shown in FIG. 44, it is different from the processes shown in FIGS. 41 to 43 in that the chip 1 is also embedded in the second redistribution layer 93. This chip may be the same as or different from the embedded chip of FIGS. 36 to 39. The chip 1 may also be embedded in the second redistribution layer on the upper side of the power module. The power module shown in FIG. 45 is formed through cutting along the cutting plane. That is to say, the chip can also be embedded in the connection layer. With this process, a power module with multiple chips arranged perpendicularly to each other can be realized, which is advantageous in realizing a more complicated power module with higher power density.

Figure 46:
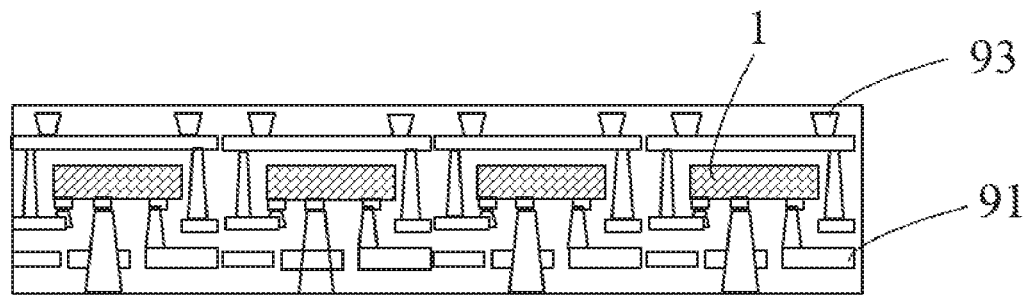
FIG. 46 is a schematic diagram of a process of a first step of another method for manufacturing a power module of the present disclosure.
Figure 47:
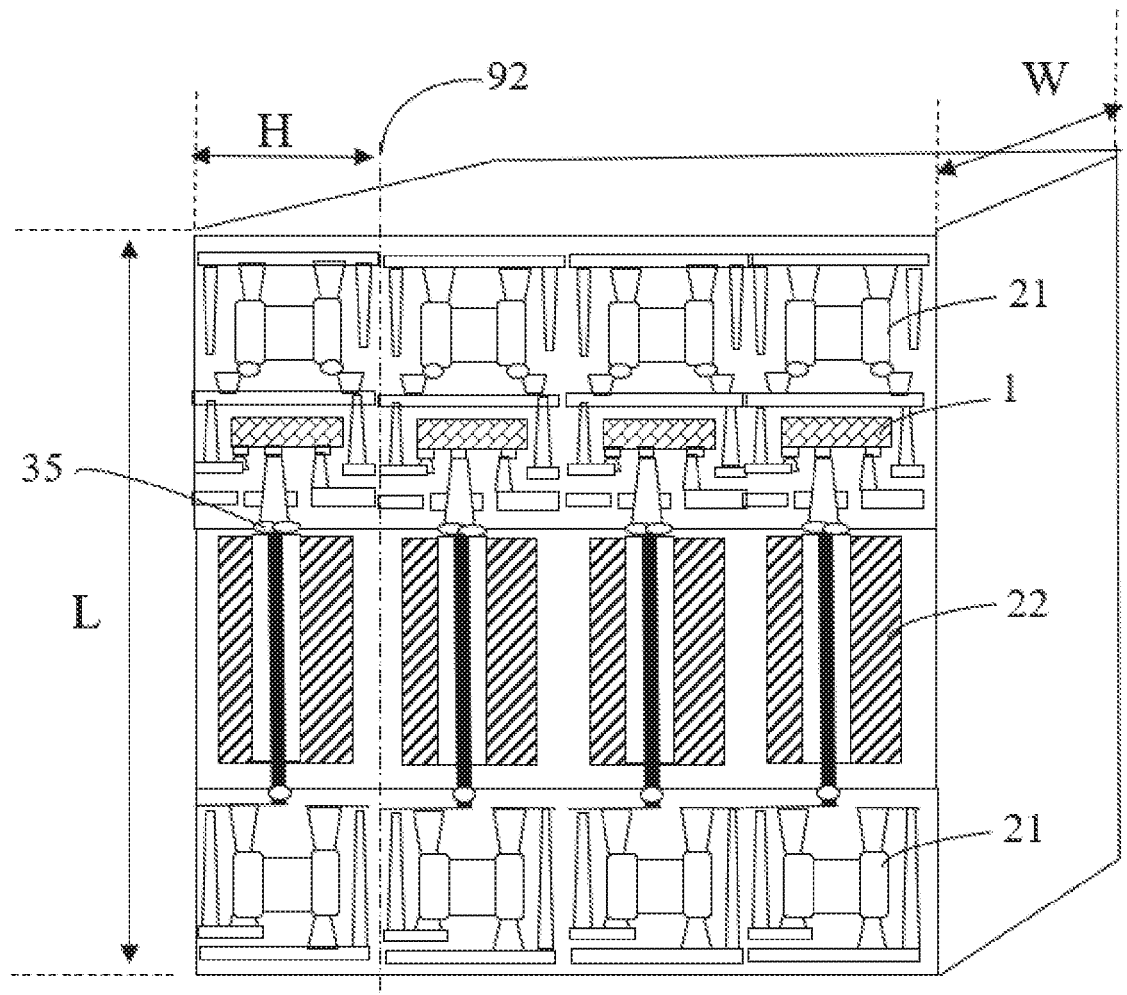
FIG. 47 is a schematic diagram of a process of a second step of another method for manufacturing a power module of the present disclosure.
Figure 48:
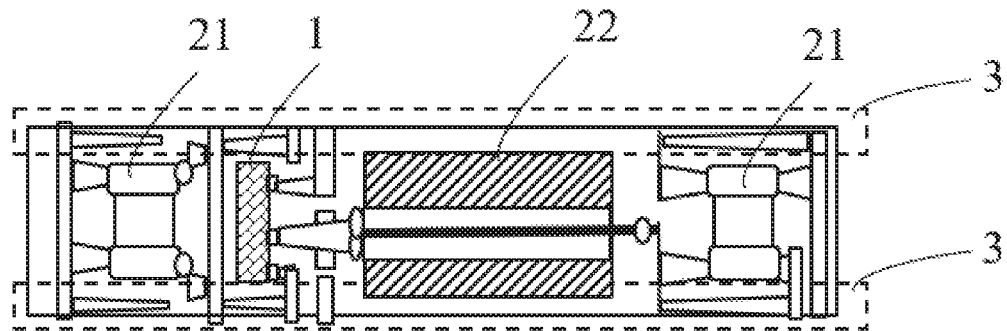
FIG. 48 is a schematic structural view of a power module formed by another method for manufacturing a power module of the present disclosure.

FIGS. 46 to 48 are schematic diagrams of another method for manufacturing a power module according to the present disclosure. This method differs from the previous embodiment in that the chip 1 can be embedded in the insulating packaging material first and then the first redistribution layer 91 can be formed as shown in FIG. 46. The second redistribution layer 93 can also be provided above the chip 1. Then, as shown in FIG. 47, other passive elements are integrated, for example, continuing to embed the inductor 22 below electrically connecting the winding of the inductor 22 to the chip 1. For example, it is assumed that the chip 1 includes the half-bridge circuit, one end of the winding of the inductor 22 can be electrically connected to the SW terminal of the chip 1; the capacitor 21 can be further embedded above the chip 1, for example as the input capacitor of the chip 1. Another capacitor 21 can also be embedded below the inductor 22, for example as an output capacitor. The chip 1 and the winding of the inductor can also be connected through the welding spot 35, for example, connected by soldering. In other implementations, the capacitor 21 above the chip 1 and the capacitor 21 under the inductor 22 can also be electrically connected to the corresponding redistribution layer through the welding spot 35. In such a manner, it facilitates the electrical connection between the chip 1 and the redistribution layer. For example, the electrical connection can be made by metallization, which makes it easier to realize the electrical connection in complex circuits, and also improves the reliability of the chip 1. Meanwhile, in FIG. 47, it is also possible to cut the panel along the cutting plane 92 to form the power module shown in FIG. 48. In addition, by setting the length direction of the capacitor perpendicular to the cutting plane, the capacitor 21 in the power module formed through cutting the panel along the cutting plane 92 is in a vertical state, that is, the capacitor 21 shown in FIG. 48 is vertically arranged in the power module. The posture of the capacitor in the power module package body can be flexibly adjusted based on the length of the capacitor, and the capacitor can be placed horizontally or vertically as shown in FIG. 48. The process is simple and the production efficiency is high.

It should be noted that the cutting plane 92 may be parallel to or coincide with the pin-out surface of the power module, and the angle between the cutting plane 92 and the terminal-out surface of the chip 1 is greater than 45° and less than 135°. For example, the terminal-out surface of the chip is perpendicular to the pin-out surface of the power module.

The power module structure of the present disclosure can be employed in any of circuits shown in FIGS. 49 to 54. Of course, the present disclosure is not limited to these circuits, and other suitable circuits can also be applied. Cin represents an input capacitor, Co represents an output capacitor, Vin represents a positive input end of the circuit, GND represents a negative input end of the circuit, Vo represents a positive output end of the circuit, SW1 represents a midpoint of the first half-bridge circuit, SW2 represents a midpoint of the second half-bridge circuit, VI represents a positive output end of the half-bridge circuit which has a output voltage different from Vo.

Figure 49:
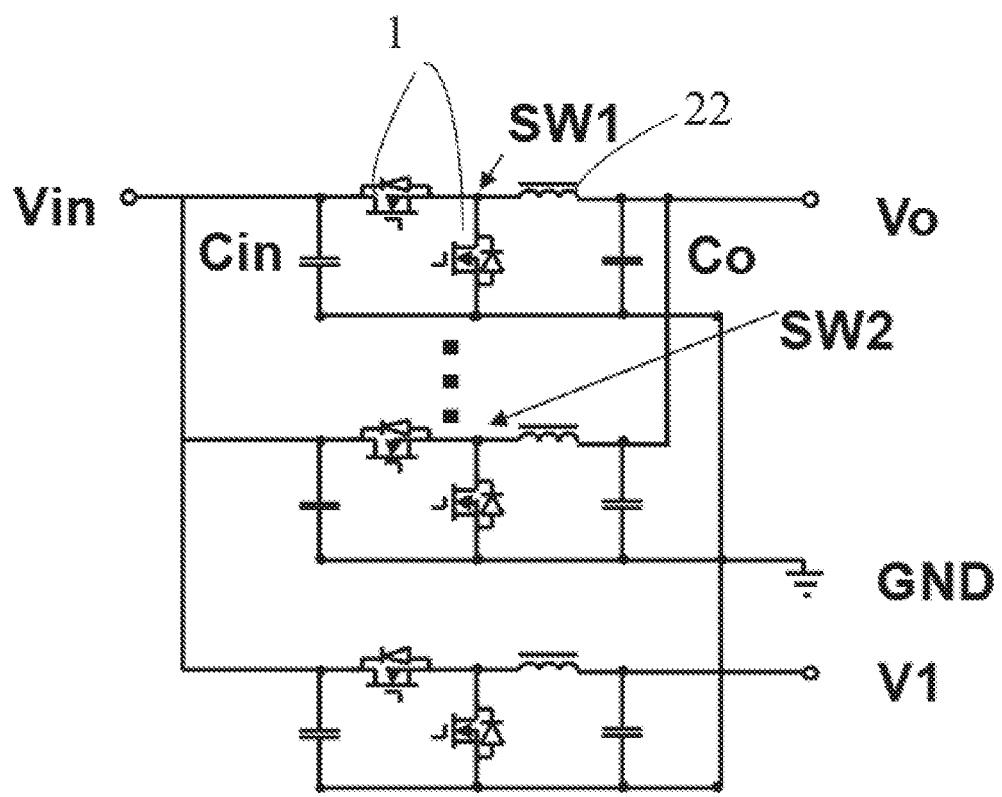
FIG. 49 is a schematic diagram of a Buck circuit according to an embodiment of the present disclosure.
Figure 50:
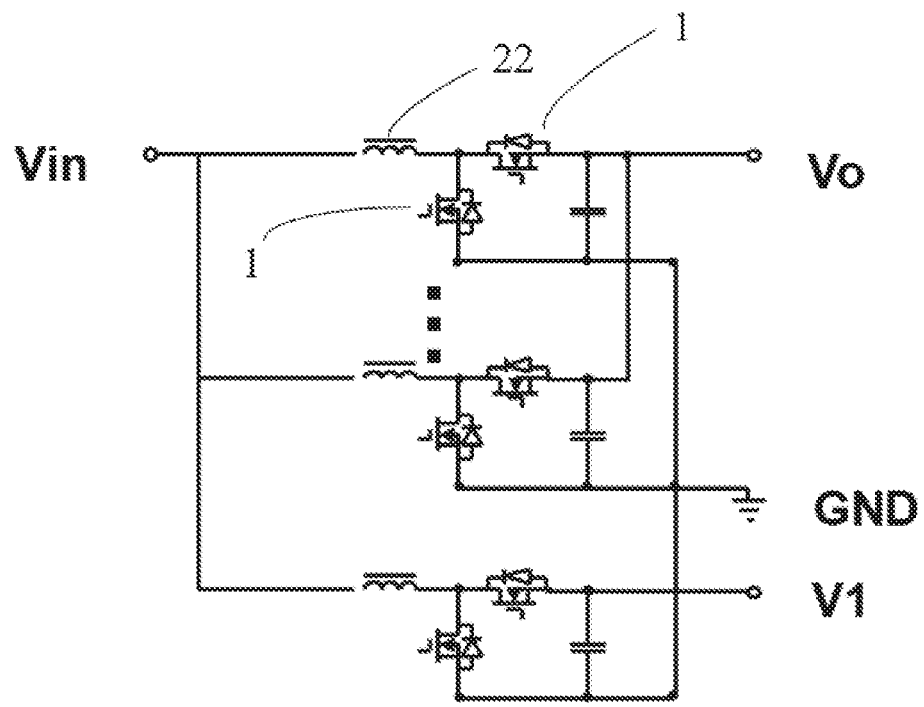
FIG. 50 is a schematic diagram of a Boost circuit according to an embodiment of the present disclosure.
Figure 51:
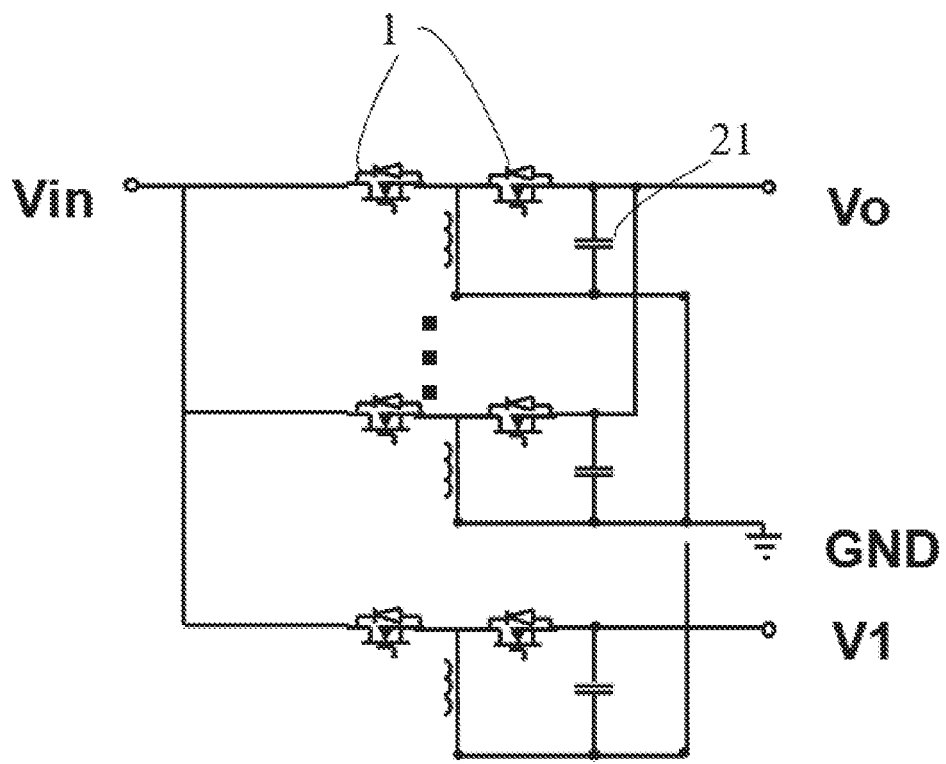
FIG. 51 is a schematic diagram of a Buck/Boost circuit according to an embodiment of the present disclosure.
Figure 52:
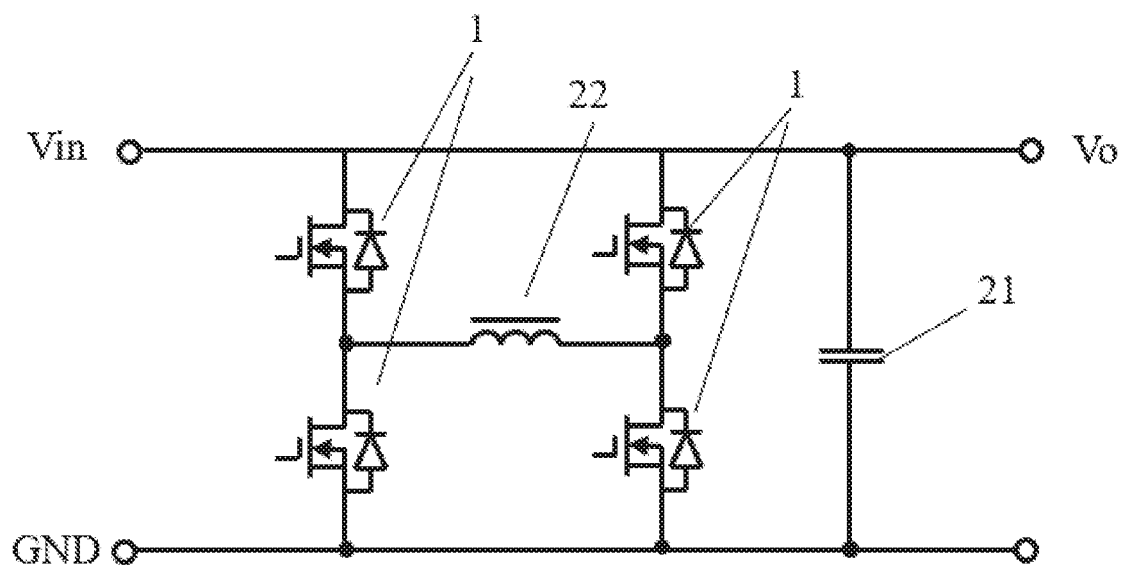
FIG. 52 is a schematic diagram of a buck-boost circuit with four switches according to an embodiment of the present disclosure.

FIG. 49 illustrates a Buck circuit. FIG. 50 illustrates a Boost circuit. FIG. 51 illustrates a Buck/Boost circuit. FIG. 52 illustrates a Buck/Boost circuit with four switches, and FIG. 53 illustrates an LLC circuit. FIG. 54 illustrates a switching capacitor circuit. Although the circuits shown in FIGS. 49 to 54 are taken as examples to describe the power module, the embodiments of the present disclosure can also be applied to other circuit topologies. For example, the other circuits include but are not limited to a Cuk circuit or a flyback circuit. With reference to similar designs and analysis, it is possible to obtain similar performance and effect improvements.

In summary, with the power module of the present disclosure, since the chip and the passive element are tiled, it is easier to realize the power module with a small height compared with the stacked structure. Since the chip is basically arranged vertically, the connection between the chip and the passive element is more direct, which can reduce current impedance and loss or parasitic inductance; and since the chip is basically arranged vertically, it is advantageous in reducing the footprint of the power module and making the structure more compact and the power density higher. The power module with such arrangement has better symmetry on the upper and lower surfaces, and it is more convenient to provide the heat dissipation paths or the connection pins symmetrically on the upper and lower surfaces.

The exemplary embodiments of the present disclosure have been described above. It shall be understood that the above embodiments are merely examples for implementing the present disclosure and are not intended to limit the scope of the present disclosure. Rather, various modifications and changes can be made without departing from the scope thereof, which fall within the scope of the present disclosure.

What is claimed is:

1. A power module, comprising:
   a chip with a chip terminal provided on a terminal-out surface of the chip, wherein the chip comprises a switching element;
   a passive element electrically connected to the chip terminal of the chip; and
   connection pins provided on a pin-out surface of the power module and electrically connected to at least one of the chip terminal of the chip and the passive element,
   wherein a projected area of the chip on the pin-out surface of the power module does not overlap with a projected area of the passive element on the pin-out surface of the power module, and an angle between the terminal-out surface of the chip and the pin-out surface of the power module is greater than 45° and less than 135°, the projected area being an imaginary area and the pin-out surface being a surface of the power module with the connection pins exposed thereon, and
   wherein a packaging material is filled inside the power module, the chip and the passive element are embedded in the packaging material, and
   wherein the power module further comprises a line layer and a connection layer, the chip and the passive element are connected to each other through the line layer in the packaging material, the connection pins are electrically connected to at least one of the chip terminal of the chip and the passive element through the connection layer, and each of the line layer and the connection layer comprises a metal distribution layer.

2. The power module according to claim 1, wherein the terminal-out surface of the chip is perpendicular to the pin-out surface of the power module.

3. The power module according to claim 1, wherein the power module comprises two opposite terminal-out surfaces respectively provided with the connection pins thereon; and
   the power module comprises a plurality of chips, and projected areas of the plurality of chips on the pin-out surface of the power module do not overlap with each other.

4. The power module according to claim 1, wherein the connection layer is provided between the pin-out surface of the power module and the chip.

5. The power module according to claim 1, wherein the power module comprises two chipsets, each of the chipsets comprises at least one chip, and the terminal-out surfaces of the two chipsets are arranged face-to-face; and
   at least one passive element is provided between the terminal-out surfaces of the two chipsets.

6. The power module according to claim 1, wherein the power module comprises a first chipset and a second chipset, each of which comprises at least one chip;
   the passive element comprises a magnetic element which comprises a first winding electrically connected to the first chipset and a second winding electrically connected to the second chipset; and
   the magnetic element comprises at least one of a coupled inductor, an uncoupled inductor, a planar transformer, and a foil-wound transformer.

7. The power module according to claim 6, wherein the chips in the first chipset are provided on a first side and a second side of the magnetic element, respectively, and the chips in the second chipset are provided on the first side and the second side of the magnetic element, respectively, the first side being opposite to the second side.

8. The power module according to claim 6, wherein the first chipset comprises two first chips connected in series, the second chipset comprises two second chips connected in series, and a connection point of the two first chips connected in series is electrically connected to the first winding, and a connection point of the two second chips connected in series is electrically connected to the second winding.

9. The power module according to claim 1, wherein the passive element comprises a multiphase reversely-coupled inductor which comprises a plurality of windings arranged side by side, and the power module comprises the chips which are respectively corresponding to and electrically connected with the respective windings;
the chips electrically connected to adjacent windings are disposed on opposite sides of the multiphase reversely-coupled inductor; and
a middle pillar corresponding to each of the windings is provided perpendicularly to the pin-out surface of the power module, and the winding is electrically connected to the connection pins after being wound back to a side of the corresponding chip.

10. The power module according to claim 1, wherein the passive element comprises a multiphase reversely-coupled inductor which comprises a plurality of windings arranged side by side, and the power module comprises the chips which are respectively corresponding to and electrically connected with the respective windings,
the chips are all provided on a same side of the multiphase reversely-coupled inductor,
a middle pillar corresponding to each of the windings is provided parallel to the pin-out surface of the power module, and the winding is electrically connect to the connection pins on a side opposite to the corresponding chip after being bent.

11. The power module according to claim 1, wherein the passive element comprises a magnetic element, a window direction of a magnetic core of the magnetic element is perpendicular to the pin-out surface of the power module or perpendicular to the terminal-out surface of the chip.

12. The power module according to claim 1, wherein the passive element comprises at least one capacitor, and a length direction of the capacitor is perpendicular to the pin-out surface of the power module.

13. The power module according to claim 1, wherein the chip comprises a back surface opposite to the terminal-out surface, and a conductive line is connected between the back surface of the chip and a surface of the power module;
wherein, the conductive line is in contact with or electrically connected to the back surface of the chip through a conductive via, and is exposed on the surface of the power module; or
the conductive line is in contact with or electrically connected to the back surface of the chip, and is connected to the surface of the power module through the conductive via.

14. The power module according to claim 1, wherein a thermal conductive pillar or a thermal conductive plate is provided on a surface of the power module.

15. The power module according to claim 1, wherein each chip comprises a switching element, a plurality of switching elements connected in parallel, or two switching elements connected in series;
the chip and the passive element constitute at least one of a buck circuit, a boost circuit, a buck/boost circuit, an LLC circuit, a switching capacitor circuit, a Cuk circuit, and a flyback circuit.

16. A method for manufacturing a power module, comprising:
stacking and packaging passive elements and chips in a first packaging material, so that an angle between terminal-out surface of each of the chips and a stacking direction of the first packaging material is greater than 45° and less than 135°, and the passive elements are electrically connected to chip terminals of the chips, to form a power module panel, wherein each of the chips comprises a switching element; and
cutting the power module panel along a first cutting plane to form a plurality of power modules, forming connection pins by conductive portions exposed after the cutting, and forming a first connection layer between a pin-out surface of each of the power modules and the chip of the power module, the first connection layer being configured to electrically connect the connection pins to at least one of a chip terminal of the chip and the passive element of the power module, and forming a line layer, the chip and the passive element in each of the power modules being connected to each other through the line layer, wherein each of the line layer and the connection layer comprises a metal distribution layer;
in each of the power modules, a projected area of the chip on the pin-out surface of the power module does not overlap with a projected area of the passive element on the pin-out surface of the power module, and an angle between the terminal-out surface of the chip and the pin-out surface of the power module is greater than 45° and less than 135°, the projected area being an imaginary area and the pin-out surface being a surface of the power module with the connection pins exposed thereon.

17. The method for manufacturing the power module according to claim 16, wherein after forming a plurality of power modules, the method further comprises:
packaging the plurality of power modules in a second packaging material, pin-out surfaces of the plurality of power modules being coplanar with each other, forming a second connection layer in the second packaging material layer, the second connection layer being electrically connected to the first connection layer, so that an angle between the first connection layer and the second connection layer is greater than 45° and less than 135°, to form a second power module panel; and
cutting the second power module panel along a second cutting plane to form the individual power modules.

18. The method for manufacturing the power module according to claim 17, wherein after forming the second connection layer, the method further comprises packaging the chip on a side of the second connection layer.

19. The method for manufacturing the power module according to claim 16, wherein the passive element comprises at least one capacitor, and the capacitor is packaged in the first packaging material so that a length direction of the capacitor is perpendicular or parallel to the first cutting plane.

20. The method for manufacturing the power module according to claim 16, wherein forming the power module panel comprises packaging the passive elements to form a passive element package panel, forming a chip package panel with the chips, welding the passive element package panel and the chip package panel, and electrically connecting the passive elements and the chips to form the power module panel; or
wherein forming the power module panel comprises packaging the passive elements to form a passive element package panel, packaging the chips by using the passive element package panel as a substrate to form the power module panel, or
forming the power module panel comprises packaging the chips to form a chip package panel, and packaging the passive elements by using the chip package panel as a substrate to form the power module panel.

* * * * *